(12) United States Patent
Aoki et al.

(10) Patent No.: US 7,012,490 B2
(45) Date of Patent: Mar. 14, 2006

(54) HIGH FREQUENCY SIGNAL TRANSMISSION STRUCTURE

(75) Inventors: Yutaka Aoki, Ome (JP); Sayaka Nishikado, Yokohama (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 10/880,920

(22) Filed: Jun. 30, 2004

(65) Prior Publication Data

US 2004/0239439 A1    Dec. 2, 2004

Related U.S. Application Data

(63) Continuation of application No. PCT/JP03/14659, filed on Nov. 18, 2003.

(30) Foreign Application Priority Data

Nov. 21, 2002 (JP) .............. 2002-337327
Nov. 28, 2002 (JP) .............. 2002-345420

(51) Int. Cl.
*H01P 1/00* (2006.01)
(52) U.S. Cl. .............. 333/247; 333/263; 333/33
(58) Field of Classification Search ............ 333/33–35, 333/263, 246, 247; 438/612, 637; 257/664, 257/662, 734–736
See application file for complete search history.

(56) References Cited

U.S. PATENT DOCUMENTS

| | | | |
|---|---|---|---|
| 5,872,393 A * | 2/1999 | Sakai et al. | 257/664 |
| 6,255,920 B1 * | 7/2001 | Ohwada et al. | 333/206 |
| 6,400,234 B1 | 6/2002 | Ohhaishi et al. | |
| 6,479,900 B1 * | 11/2002 | Shinogi et al. | 257/758 |
| 6,803,664 B1 * | 10/2004 | Murayama | 257/779 |
| 2001/0054939 A1 | 12/2001 | Zhu et al. | |
| 2002/0036099 A1 | 3/2002 | Hachiya | |

FOREIGN PATENT DOCUMENTS

| | | |
|---|---|---|
| EP | 1 182 703 A2 | 2/2002 |
| EP | 1 251 558 A2 | 10/2002 |
| JP | 2002-124593 A | 4/2002 |

* cited by examiner

*Primary Examiner*—Robert Pascal
*Assistant Examiner*—Kimberly E. Glenn
(74) *Attorney, Agent, or Firm*—Frishauf, Holtz, Goodman & Chick, P.C.

(57) ABSTRACT

A connection pad, an insulating film, a ground layer a protective film, first to third wirings and posts $S_0$, $S_1$, G, D on the wirings are disposed on a semiconductor substrate. In this case, the first wiring transmits a high frequency signal, and a dummy pad portion and dummy post D for restraining attenuation of the high frequency signal are disposed midway in the wiring and not connected to external, circuits. An opening for decreasing a floating capacity is disposed in the ground layer under the posts $S_0$, D.

30 Claims, 21 Drawing Sheets

US 7,012,490 B2

HIGH FREQUENCY SIGNAL TRANSMISSION STRUCTURE

CROSS-REFERENCE TO RELATED APPLICATIONS

This is a Continuation Application of PCT Application No. PCT/JP03/14659, filed Nov. 18, 2003, which was not published under PCT Article 21(2) in English.

This application is based upon and claims the benefit of priority from prior Japanese Patent Applications No. 2002-337327, filed Nov. 21, 2002; and No. 2002-345420, Nov. 28, 2002, the entire contents of both of which are incorporated herein by reference.

BACKGROUND OF THE INVENTION

1. Field of the Invention

The present invention relates to a high frequency signal transmission structure including a high frequency signal wiring for transmitting high frequency signals.

2. Description of the Related Art

For a semiconductor device constituted of a conventional high frequency circuit, as disclosed in Jpn. Pat. Unexamined Publication No. 2002-124593, a device has been known in which a dielectric substrate is disposed between a semiconductor integrated circuit device of Si, GaAs, or the like, and a circuit substrate. A ground device of the semiconductor integrated circuit device is connected to a ground line of the circuit substrate via a via-hole disposed in the dielectric substrate. For the semiconductor device, a built-in integrated circuit is divided and formed in a plurality of circuit blocks in the semiconductor integrated circuit device. A plurality of ground electrodes connected to the corresponding circuit blocks are formed on the surface of the dielectric substrate disposed opposite to the circuit substrate, a parasitic inductance generated in the dielectric substrate is separated for each circuit block, and wraparound of the high frequency signal can be prevented.

In this structure, since connection of the semiconductor integrated circuit device to the dielectric substrate, and connection of the dielectric substrate to the circuit substrate need to be performed, respectively, productivity is bad. Since the via-hole has a simply linear column shape, it is necessary to draw around the high frequency signal wiring on the semiconductor integrated circuit device and to connect the wiring to a predetermined integrated circuit device. However, in the conventional semiconductor device, attenuation of the high frequency signal in the signal wiring formed in the semiconductor integrated circuit device is remarkable.

BRIEF SUMMARY OF THE INVENTION

An object of the present invention is to provide a semiconductor device which can enhance productivity, that is, a high frequency signal transmission structure. Another object of the present invention is to provide a semiconductor device which can reduce attenuation of a high frequency signal.

According to one aspect of the present invention, there is provided a high frequency signal transmission structure comprising: a substrate; and a high frequency signal wiring formed on the substrate, the high frequency signal wiring including a connection portion, a pad portion for external connection, and one or more dummy pad portions which are disposed between the connection portion and the pad portion for external connection to restrain attenuation of a high frequency signal.

DETAILED DESCRIPTION OF THE INVENTION

First Embodiment

Figure 1:
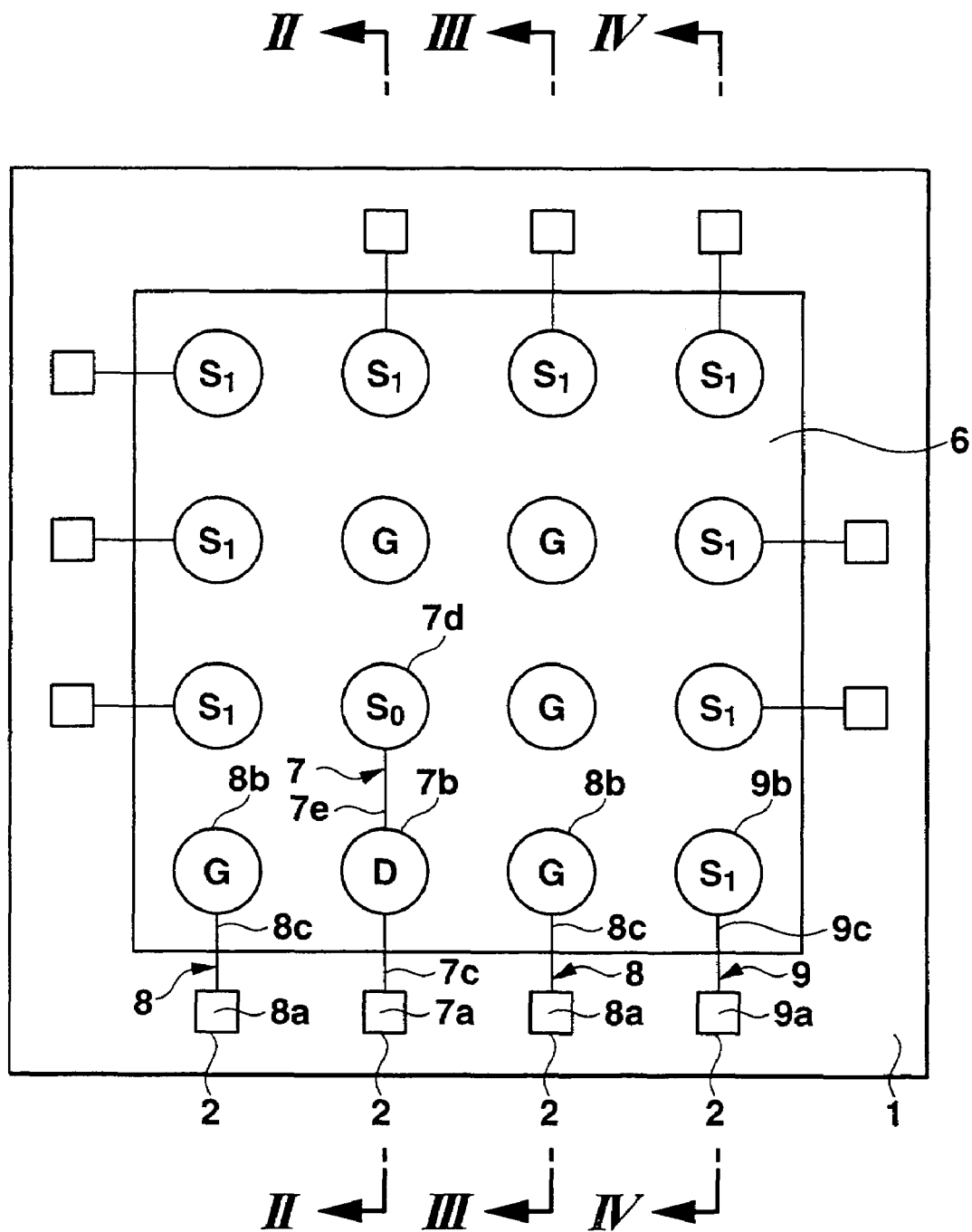
FIG. 1 is a perspective plan view of a major part of a semiconductor device according to one embodiment of the present invention.
Figure 2:
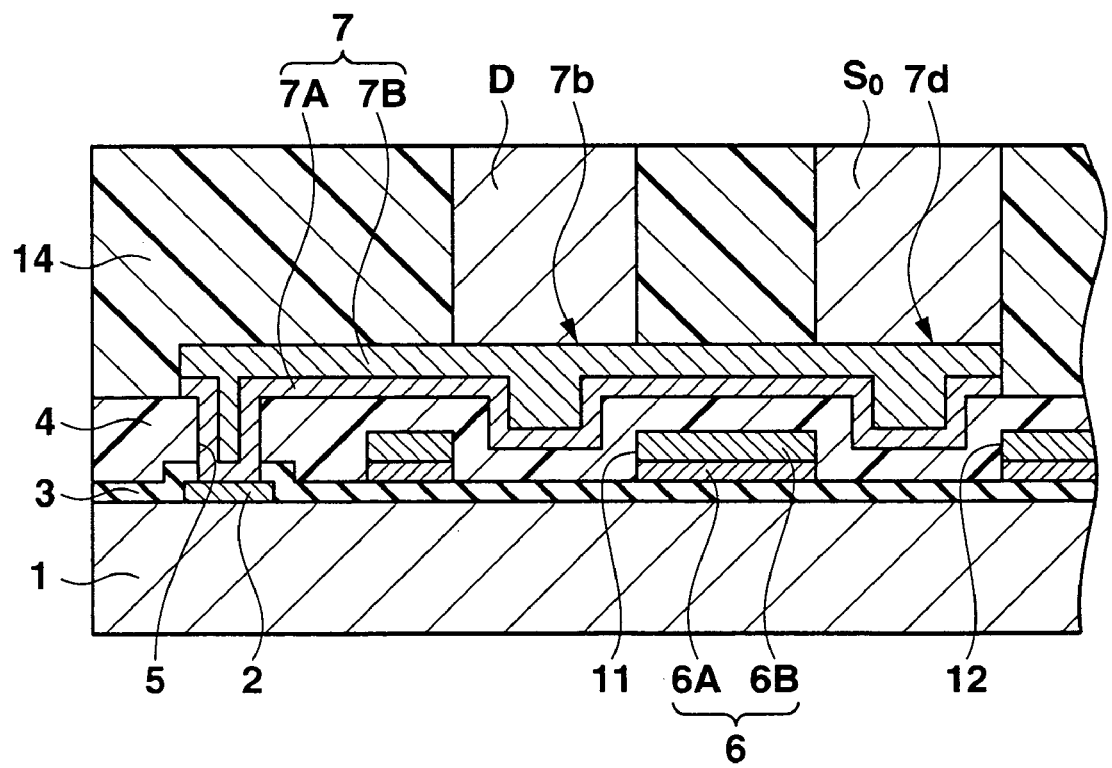
FIG. 2 is a sectional view of a part taken along line II—II of FIG. 1.
Figure 3:
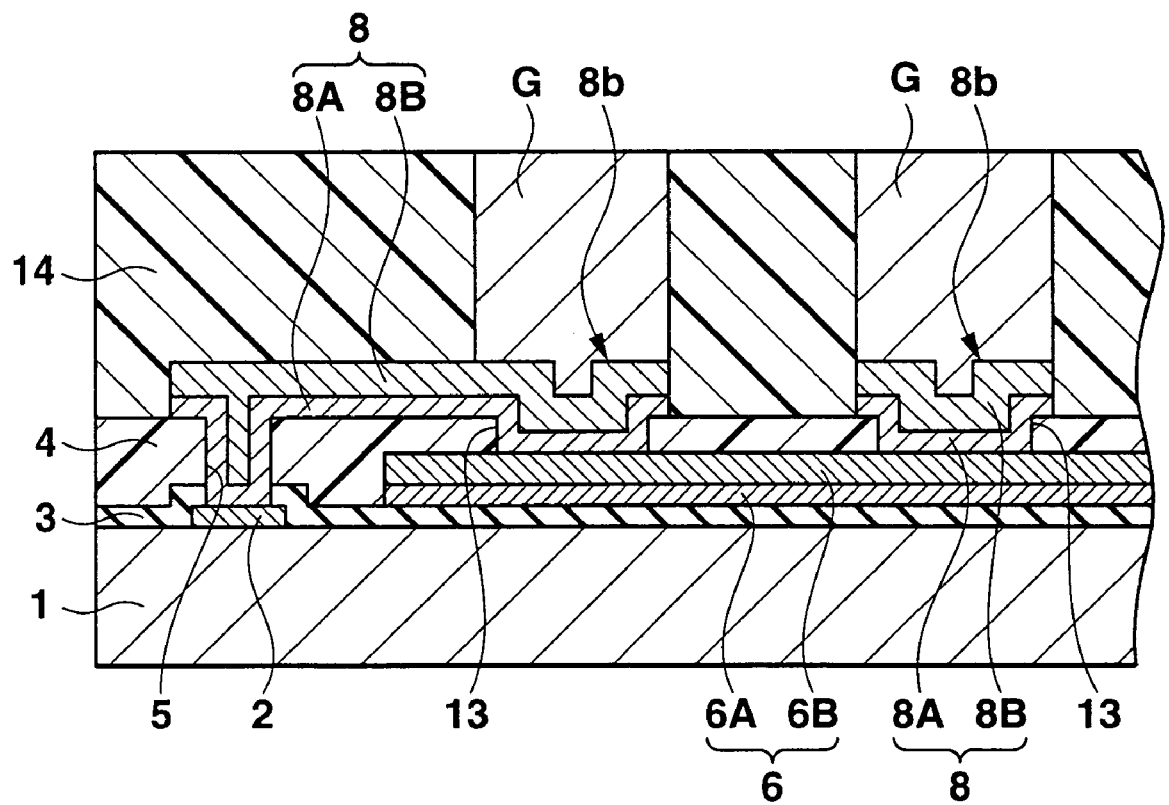
FIG. 3 is a sectional view of a part taken along line III—III of FIG. 1.
Figure 4:
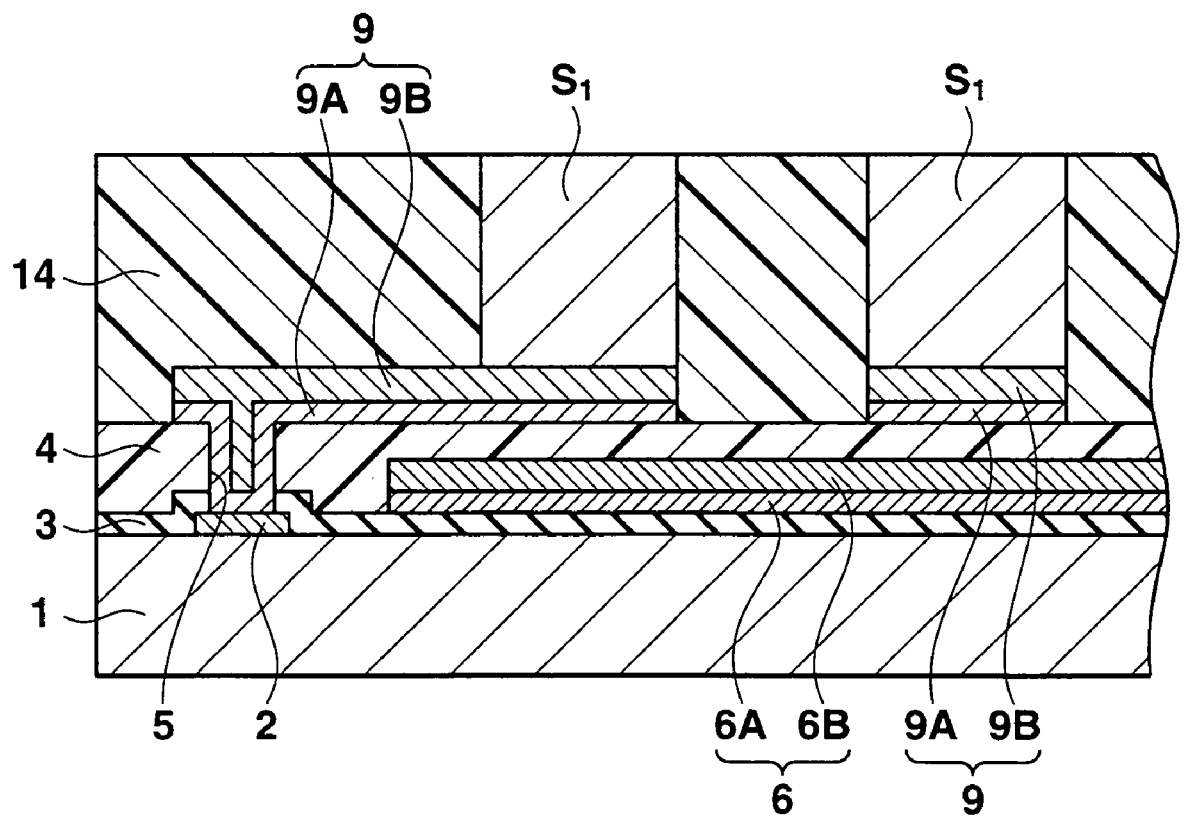
FIG. 4 is a sectional view of a part taken along line IV—IV of FIG. 1.

FIG. 1 is a perspective plan view of a major part of a semiconductor device according to one embodiment of the present invention, FIG. 2 is a sectional view of a part taken along line II—II of FIG. 1, FIG. 3 is a sectional view of a part taken along line III—III of FIG. 1, and FIG. 4 is a sectional view of a part taken along line IV—IV of FIG. 1. This semiconductor device is called a chip size package (CSP), includes, for example, a transmitted/received signal circuit of Bluetooth, and is incorporated in electronic apparatuses such as a cellular phone.

The semiconductor device includes a semiconductor substrate 1 which has a planar square shape and which is formed of Si or GaAs. In an upper surface peripheral portion of the semiconductor substrate 1, a plurality of connection pads 2 formed of aluminum are electrically connected to and disposed in an integrated circuit or circuits (not shown) including one or more transmitted/received signal circuits disposed in an upper surface middle part of the semiconductor substrate 1. An insulating film 3 formed of inorganic insulating materials such as silicon oxide and a protective film (insulating film) 4 formed of organic resins such as polyimide are successively stacked and disposed on the upper surfaces of the connection pads 2 and semiconductor substrate 1 excluding the middle parts of the respective connection pads 2. The middle parts of the connection pads 2 are exposed via openings 5 formed in the insulating film 3 and protective film 4.

A ground layer 6 is disposed under the protective film 4 on the upper surface middle part of the insulating film 3. The ground layer 6 is constituted of an underlying metal layer 6A of copper, and an upper metal layer 6B disposed on the underlying metal layer 6A and formed of copper. The layer 6 is formed substantially all over the inside of a region in which the connection pads 2 are formed, excluding a partial region described later as shown in FIG. 1. First to third wirings 7, 8, 9 are disposed over to predetermined positions of the upper surface of the protective film 4 from the upper surfaces of the connection pads 2 exposed via the openings 5. The first to third wirings 7, 8, 9 are also constituted of underlying metal layers 7A, 8A, 9A of copper and upper metal layers 7B, 8B, 9B disposed on the underlying metal layers 7A, 8A, 9A and formed of copper. The first to third wirings 7, 8, 9 are simultaneously formed by plating.

The first wiring (high frequency signal wiring) 7 is a transmission/reception signal line connected to a high frequency processing circuit incorporated in Bluetooth. The wiring 7 is constituted of: a square connection portion 7a formed of a portion connected to the connection pad 2; a circular dummy pad portion 7b; a leading line 7c connecting the connection portion 7a to the dummy pad portion 7b; a circular pad portion for external connection 7d; and a leading line 7e connection both the pad portions 7b, 7d. In this case, only one first wiring 7 is shown as the transmission/reception signal line, but a transmission signal line may be formed separately from a reception signal line.

The second wiring 8 is a ground line, and is constituted of: a square connection portion 8a formed of the portion connected to the connection pad 2; a circular pad portion for external connection 8b; and a leading line 8c connecting the connection portion 8a to the pad portion for external connection 8b. The third wiring 9 is a wiring for circuit other than a transmission/reception wiring, and is constituted of: a square connection portion 9a formed of the portion connected to the connection pad 2; a circular tip-end pad portion 9b; and a leading line 9c connecting the connection portion 9a to the pad for external connection 9b. Here, as shown in FIG. 1, the second wirings 8 which are ground lines are disposed on opposite sides of the first wiring 7 which is the transmission/reception signal line and along the first wiring 7.

A post for external connection $S_0$ formed of copper and having a columnar shape is disposed on the upper surface of the pad portion for external connection 7d of the first wiring 7. A dummy post D formed of copper is disposed on the upper surface of the dummy pad portion 7b of the first wiring 7. Ground posts for external connection G formed of copper and having the columnar shape are respectively disposed in the pad portions for external connections 8b of the second wirings 8. Posts for external connection $S_1$ formed of copper and having the columnar shape are disposed on the upper surface of the pads for external connection 9b of the third wirings 9.

All the posts $S_0$, $S_1$, G, D are disposed above the ground layer 6 as shown in FIG. 1, are simultaneously formed by plating, and have substantially the same height. The dummy post D may have the same diameter as that of the other posts $S_0$, $S_1$, G, or a different diameter.

As shown in FIG. 2, openings 11, 12 having substantially the same sizes as those of the pad portions 7b, 7d are formed in the portions of the ground layer 6 under the dummy pad portion 7b and pad portion for external connection 7d of the first wiring 7. As shown in FIG. 3, the pad portion 8b under the ground post G is connected to the ground layer 6 via an opening 13 formed in the protective film 4. As shown in FIGS. 1 and 3, the ground posts G disposed in the middle parts are electrically connected to the ground layer 6 via the insular pad portions 8b, and the ground layer 6 are connected to the connection pads 2 via the leading lines 8c.

A sealing film 14 formed of organic resins such as an epoxy-based resin is disposed on the upper surface of the protective film 4 and the first to third wirings 7, 8, 9 excluding all the posts $S_0$, $S_1$, G, D in such a manner that the upper surface of the sealing film constitutes substantially the same plane as that of the upper surfaces of all the posts $S_0$, $S_1$, G, D.

Here, in the present invention, terms "the dummy pad portion" and "the dummy post" are defined as a pad portion and post which are positioned in terminal ends of a circuit in the form of an equivalent circuit and which are not connected to another circuit. Functions of the dummy pad portion 7b and dummy post D will be described later.

As described above, in this semiconductor device, the ground layer 6 is disposed above the semiconductor substrate 1, and the first to third wirings 7, 8, 9 including the high frequency signal wiring for transmitting the high frequency signal are disposed on the ground layer 6 via the protective film 4. Therefore, the first to third wirings 7, 8, 9 including the high frequency signal wiring and the ground layer 6 may be disposed only on the upper surface of the semiconductor substrate 1. Additionally, a dielectric substrate separate from the semiconductor substrate does not have to be used, and therefore a manufacturing process can be simplified to enhance productivity.

Moreover, when the posts $S_0$, $S_1$, G disposed on the tip-end pad portions 7d, 8b (including the insular pad portion 8b shown in FIG. 3), 9b of the first to third wirings 7, 8, 9 are bonded to an external circuit substrate (not shown), solder balls can be formed on the respective posts $S_0$, $S_1$, G to collectively bond the posts, and a step of bonding the posts to another circuit substrate is also efficient. In this case, to manufacture the semiconductor device of the present invention, a wafer level package process can be applied. That is, it is also possible to use a manufacturing method in which the ground layer 6, protective film 4, wirings 7, 8, 9, posts $S_0$, $S_1$, G, D, and sealing film 14 are successively formed on the semiconductor wafer on which the connection pads 2 connected to the integrated circuit and the insulating film 3 exposing the middle parts of the connection pads 2 are formed, and the solder balls are formed on the respective posts $S_0$, $S_1$, G, D. Thereafter, dicing is performed to obtain individual semiconductor devices.

Figure 5A:
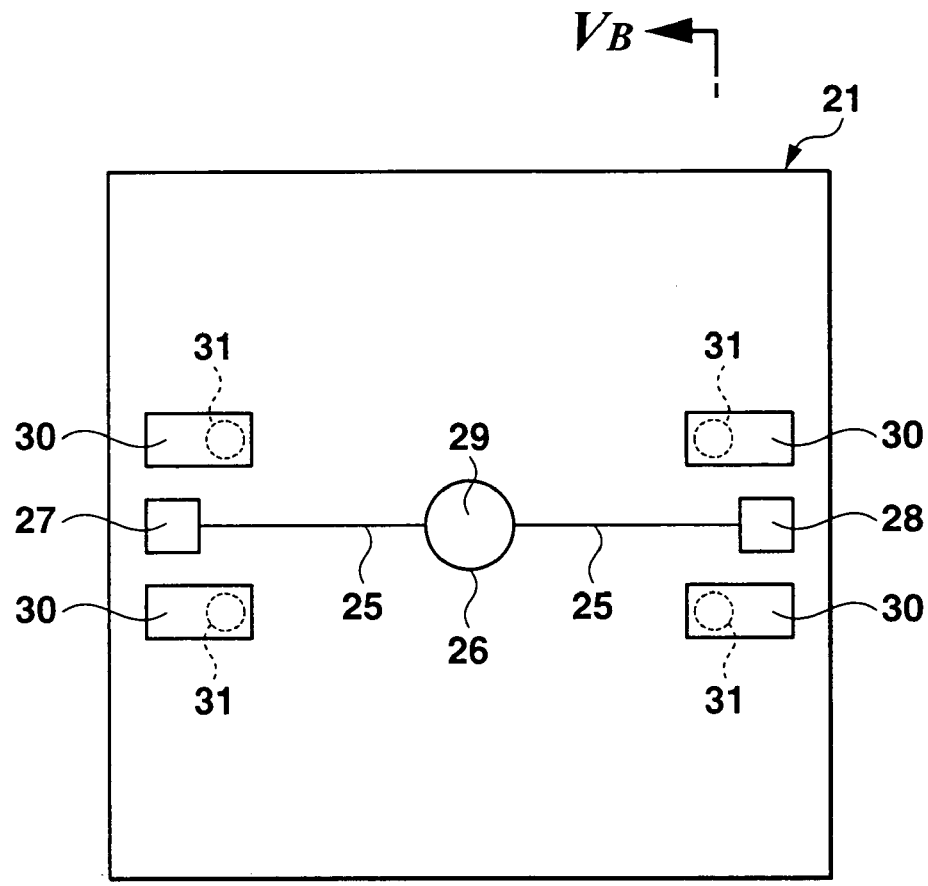
FIG. 5A is a plan view of the semiconductor device used in a first experiment.
Figure 5B:
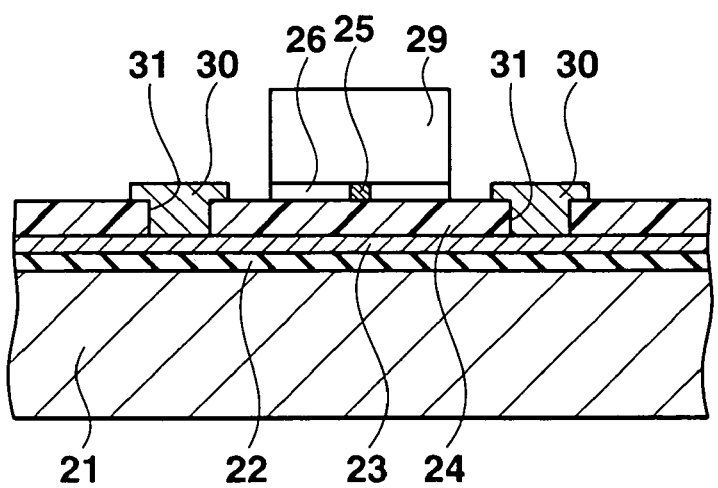
FIG. 5B is a sectional view taken along $N_B$—$N_B$ of FIG. 5A.

Next, the functions of the dummy pad portion 7b and dummy post D will be described together with experiment results. First, the semiconductor device shown in FIGS. 5A, 5B are prepared for a first experiment. This semiconductor device includes a semiconductor substrate 21 which has a planar square shape. On the upper surface of the semiconductor substrate 21, an insulating film 22 formed of inorganic materials such as silicon oxide, a ground layer 23 formed of aluminum, and a protective film 24 formed of organic resins such as polyimide are successively stacked and disposed.

A wiring 25 formed of copper is disposed to extend in a longitudinal direction in the middle part of the upper surface of the protective film 24 in a vertical direction in FIG. 5A. A circular dummy pad portion 26 is disposed in the middle part of the wiring 25. Connection terminals 27, 28 having square shapes are disposed on the opposite ends of the wiring 25. A dummy post 29 formed of copper and having the columnar shape is disposed on the upper surface of the dummy pad portion 26.

Connection terminals 30 formed of copper and having rectangular shapes are disposed in parallel with the wiring 25 on the opposite sides of the vertical direction of the connection terminals 27, 28 in the upper surface of the protective film 24. These connection terminals 30 are electrically connected to the ground layer 23 via circular openings 31 formed in the protective film 24.

Here, the wiring 25 corresponds to the first wiring 7 shown in FIG. 1. The dummy pad portion 26 corresponds to the dummy pad portion 7b shown in FIG. 1. The dummy post 29 corresponds to the dummy post D shown in FIG. 1. The ground layer 23 corresponds to the ground layer 6 shown in FIG. 1.

Next, one example of a dimension of the semiconductor device constituted as described above will be described. A plane size of the semiconductor substrate 21 is 2400×2400 $\mu$m, and a thickness is 600 $\mu$m. The thickness of the insulating film 22 is 0.5 $\mu$m. The thickness of the ground layer 23 is 1 $\mu$m. The thickness of the protective film 24 is 6 $\mu$m. The thickness of the wiring 25 including the connection terminals 27, 28 and dummy pad portion 26 is 5 $\mu$m. A width of the wiring 25 is 10 $\mu$m. A length of the wiring 25 including the dummy pad portion 26 is 1800 $\mu$m.

Each plane size of the connection terminals 27, 28 is 170×170 $\mu$m. A diameter of the dummy pad portion 26 and dummy post 29 is 300 $\mu$m. A height of the dummy post 29 is 100 $\mu$m. Each plane size of the connection terminals 30 is 340×170 $\mu$m. An interval between the respective connection terminals 30 and the corresponding connection terminals 27, 28 is 130 $\mu$m. The diameter of the opening 31 is 130 $\mu$m.

Figure 6:
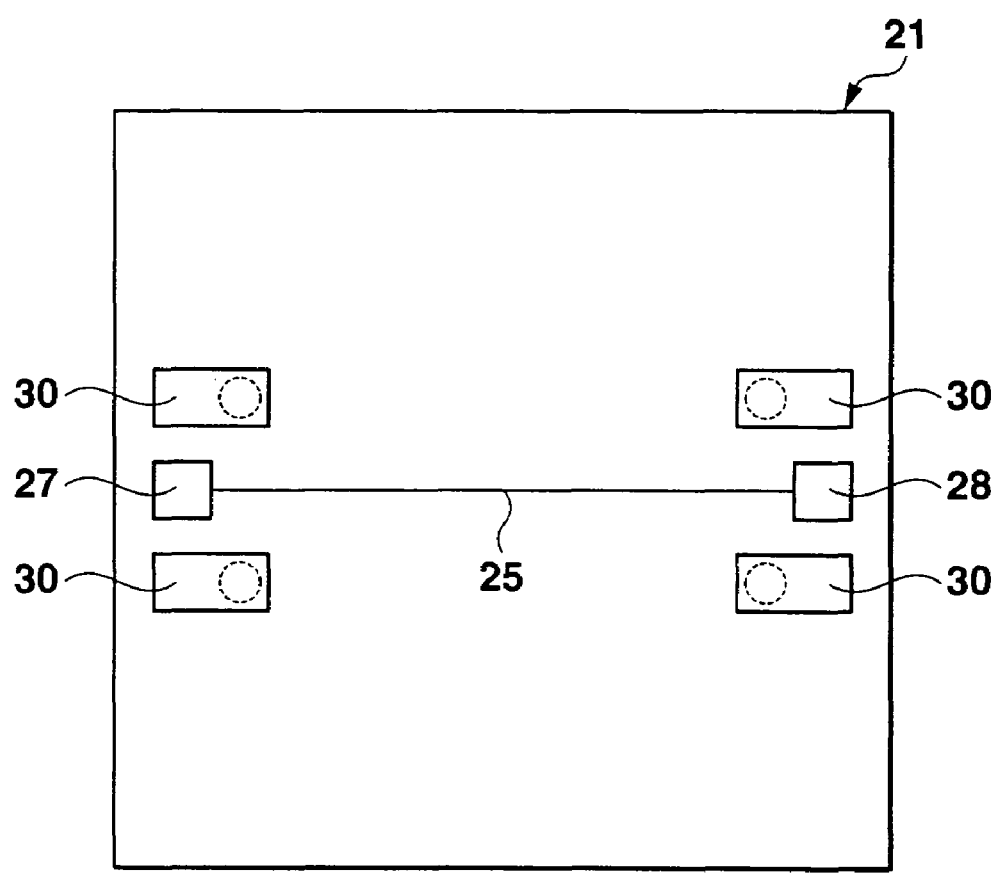
FIG. 6 is a plan view of another semiconductor device used in the first experiment.

Next, measuring instruments such as a network analyzer were used to check transmission characteristics $S_{21}$ of the high frequency signal of the semiconductor device constituted as described above. In this case, a probe for measurement was brought in contact with the connection terminals 27, 28, 30. Moreover, for the semiconductor device of the present invention, a device including the dummy post 29 on the dummy pad portion 26 (hereinafter referred to as the CSP including the post), and a device which included the dummy pad portion 26 but the dummy post 29 was not formed on the portion (hereinafter referred to as the CSP without the post) were prepared. For comparison, as shown in FIG. 6, a semiconductor device which did not include the dummy post 29 and dummy pad portion 26 and which included only the wiring 25 was prepared (hereinafter referred to as the CSP including only the wiring).

Figure 7:
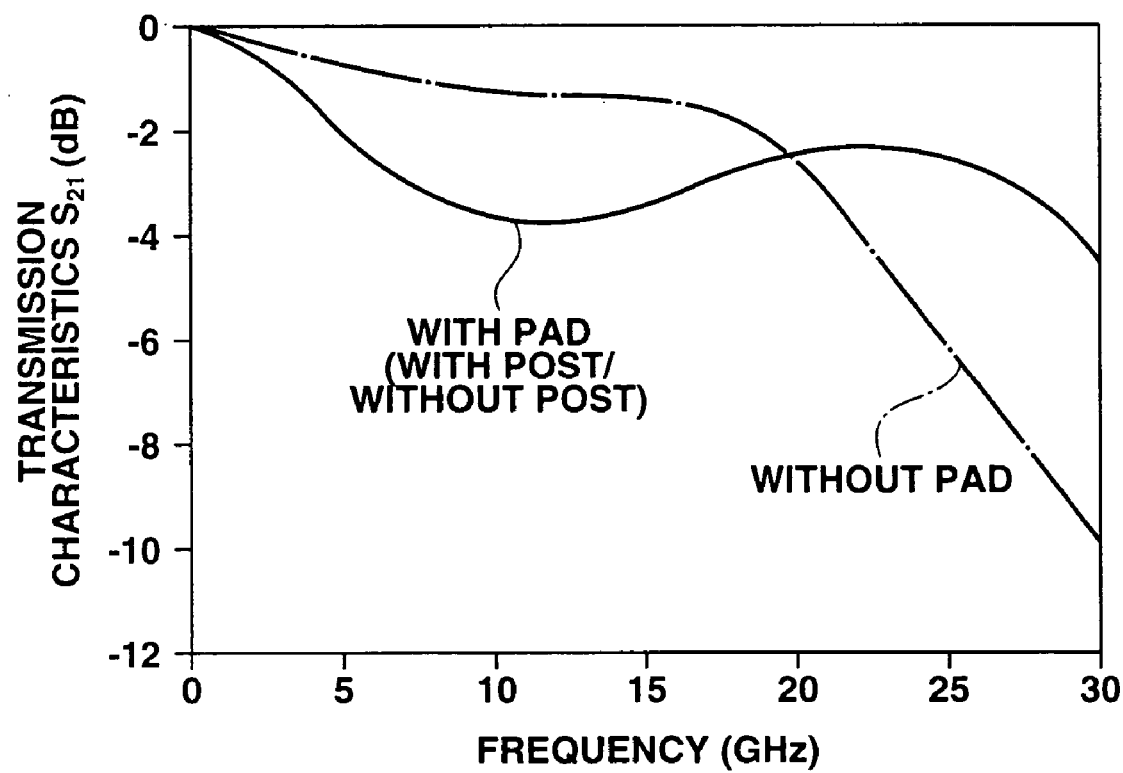
FIG. 7 is a diagram showing transmission characteristics of a high frequency signal by the first experiment.

Moreover, when the transmission characteristics $S_{21}$ of the high frequency signal of each CSP were measured, the results shown in FIG. 7 were obtained. In FIG. 7, a solid line indicates the transmission characteristics $S_{21}$ of the CSP including the post (or with the pad), and a one-dot chain line indicates the transmission characteristics $S_{21}$ of the CSP including only the wiring (or without the pad). In this case, the transmission characteristics $S_{21}$ of the CSP without the post are substantially the same as the transmission characteristics $S_{21}$ of the CSP including the post shown by the solid line, and are therefore shown by the solid line.

As apparent from FIG. 7, up to about 19 GHz, an attenuation of the high frequency signal of the CSP including only the wiring, shown by the one-dot chain line, is smaller than that of the CSP including the post and the CSP without the post, shown by the solid line. However, with a frequency exceeding about 19 GHz, this is reversed, and the attenuations of the CSP including the post and the CSP without the post, shown by the solid line, are smaller than that of the CSP including only the wiring, shown by the one-dot chain line.

Therefore, in a frequency band of about 19 GHz or more, the attenuation of the high frequency signal in the CSP including the post and the CSP without the post can be restrained as compared with that of the CSP including only the wiring. Since the transmission characteristics $S_{21}$ of the CSP including the post are substantially the same as those of the CSP without the post, a difference by the presence/absence of the post 29 is hardly seen.

Here, in FIG. 5A, it is assumed that a characteristic impedance of the portions of the wiring 25 on the left side of the dummy pad portion 26, and connection terminal 27 (i.e., the wiring 7c and connection portion 7a under the dummy pad portion 7b in FIG. 1) is $Z_1$, and the characteristic impedance of the dummy pad portion 26 and the portion of the dummy post 29 (i.e., the dummy pad portion 7b and dummy post D in FIG. 1) is $Z_2$. It is also assumed that the characteristic impedance of the portion of the wiring 25 on the left side of the dummy pad portion 26, and the connection terminal 28 (i.e., the wiring 7e, pad portion for external connection 7d, and post for external connection So above the dummy pad portion 7b in FIG. 1) is $Z_3$. Then, $Z_1 \approx Z_2 \approx Z_3$ is preferable in order to improve the transmission characteristics.

In the above-described first experiment, the wiring 25 is assumed as a straight line. Next, as a second experiment, the wiring including a bent portion will be described. In this case, the semiconductor device shown in FIG. 8 was prepared. In the semiconductor device shown in FIG. 8, the portions having the same names as those of the semiconductor device shown in FIG. 5A are denoted with the same reference numerals and described. A sectional shape of this semiconductor device is basically the same as that shown in FIG. 5B. However, in this case, only the dummy pad portion 26 is provided, and the dummy post is not disposed on the portion.

In this semiconductor device, the wiring 25 is bent and extended so as to change a direction substantially by 90° in the middle part, and the circular dummy pad portion 26 is disposed in the bent portion. In this case, a center of the dummy pad portion 26 corresponds to that of the semiconductor substrate 21, and is disposed in a bent point or a center point of the bent portion of the wiring 25.

Next, the transmission characteristics $S_{21}$ of the high frequency signal of the semiconductor device constituted as described above were checked using the measuring instruments such as the network analyzer. In this case, for the comparison, the semiconductor devices shown in FIGS. 9A, 9B were prepared. In the semiconductor device shown in FIG. 9A, the dummy pad portion 26 is disposed inside the bent portion of the wiring 25, and in the semiconductor device shown in FIG. 9B, the dummy pad portion 26 is disposed outside the bent portion of the wiring 25.

Here, a point at which two line segments of one high frequency signal wiring intersect with each other is assumed as a bent point. When the center of the dummy pad is positioned on the side having a small intersection angle of two line segments centering on the bent point, it is assumed that the pad is positioned inside the bent portion. When the center is positioned on the side having a large intersection angle of two line segments centering on the bent point, it is assumed that the pad is positioned outside the bent portion.

Figure 8:
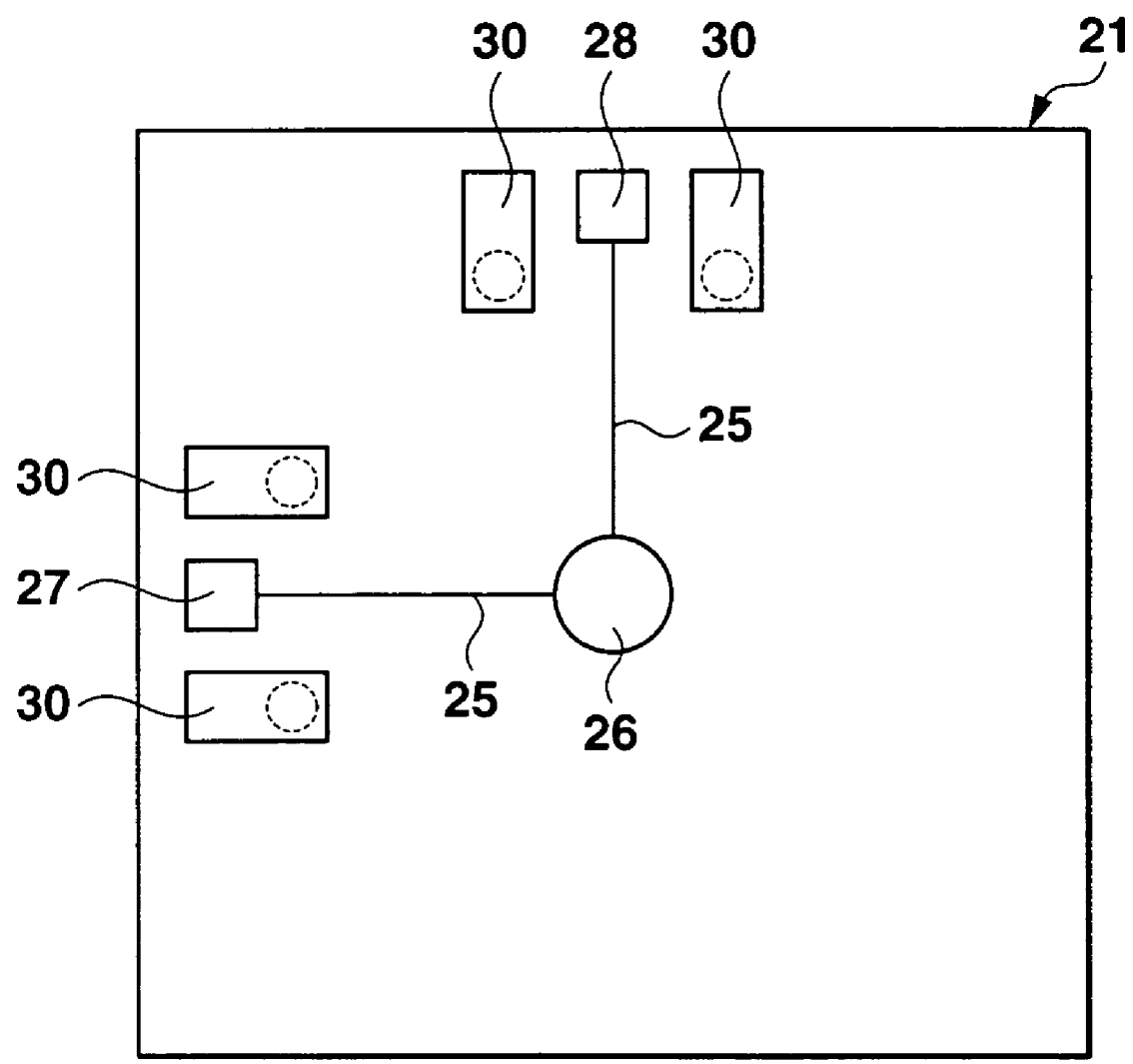
FIG. 8 is a plan view of the semiconductor device used in a second experiment.
Figure 9A:
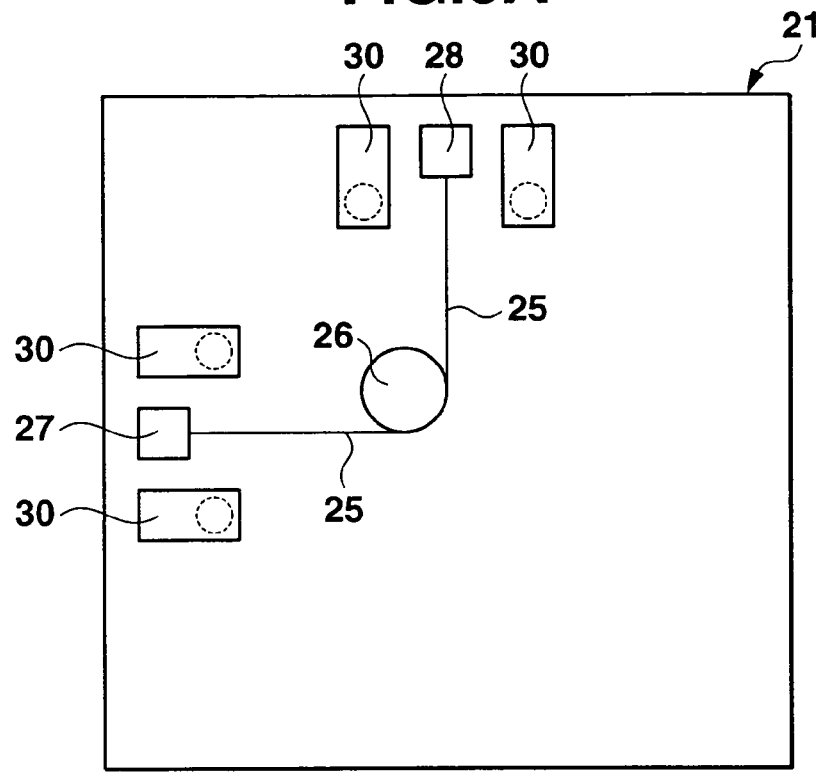
FIGS. 9A and 9B are plan views of another semiconductor device used in the second experiment.
Figure 9B:
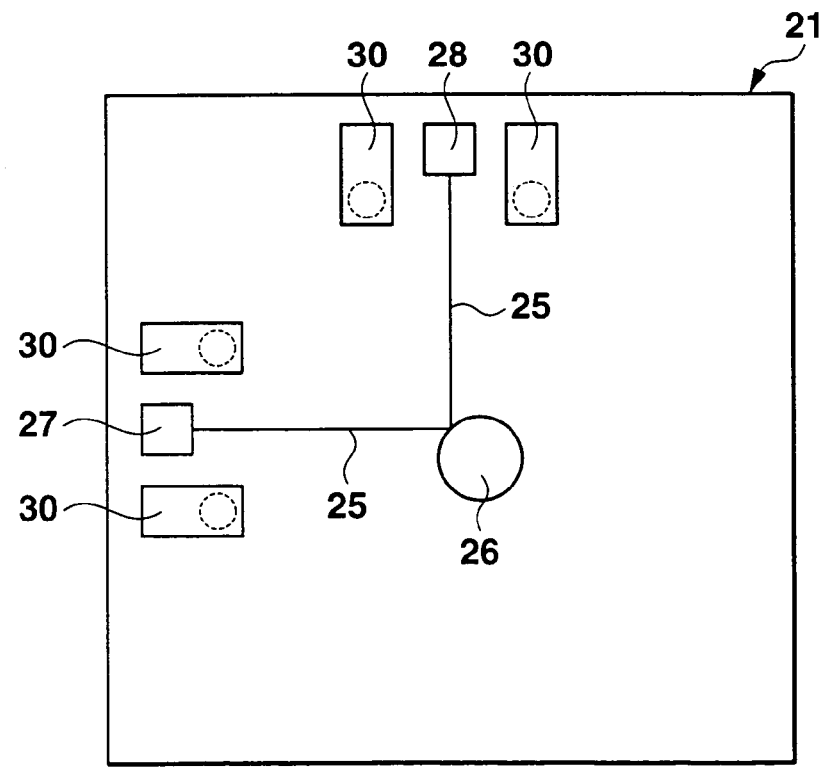
Figure 10:
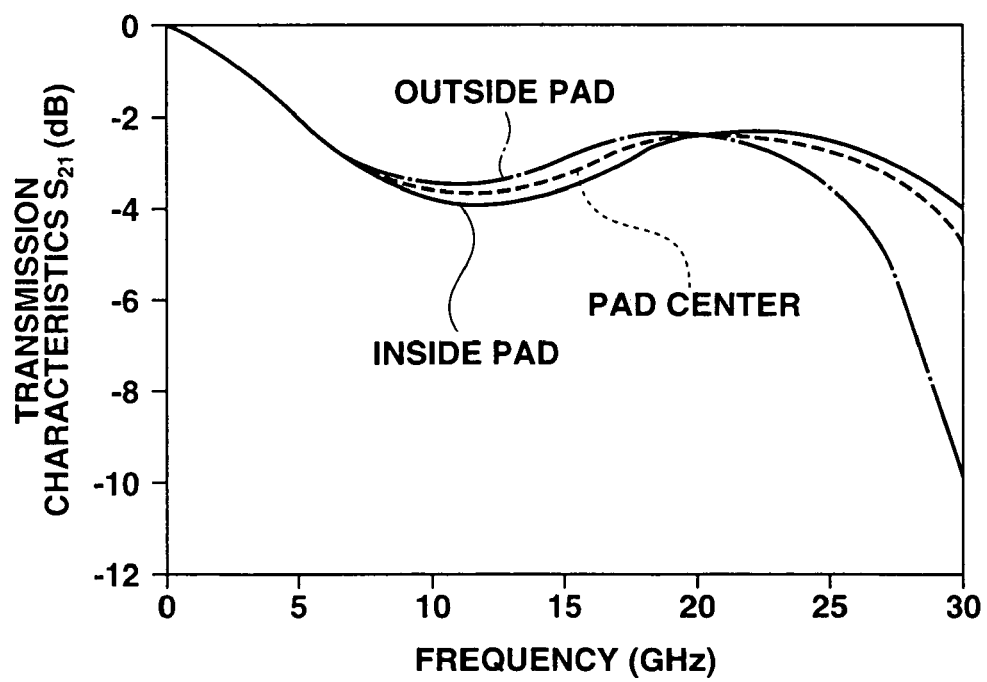
FIG. 10 is a diagram showing the transmission characteristics of the high frequency signal by the second experiment.

Next, when the transmission characteristics $S_{21}$ of the high frequency signals of the semiconductor devices shown in FIGS. 8 and 9A, 9B were measured, the results shown in FIG. 10 were obtained. In FIG. 10, the solid line shows the transmission characteristics $S_{21}$ of the semiconductor device (hereinafter referred to as the inside-pad CSP) shown in FIG. 9A, a dotted line shows the transmission characteristics $S_{21}$ of the semiconductor device (hereinafter referred to as the center-pad CSP) shown in FIG. 8, and the one-dot chain line shows the transmission characteristics $S_{21}$ of the semiconductor device (hereinafter referred to as the outside-pad CSP) shown in FIG. 9B.

As apparent from FIG. 10, the high frequency signal is substantially similarly attenuated for each CSP up to about 6 GHz. However, in a range of about 6 GHz to 19 GHz, the attenuation of the high frequency signal of the inside-pad CSP shown by the solid line is largest. Next, the attenuation of the high frequency signal of the center-pad CSP shown by the dotted line is large, and the attenuation of the high frequency signal of the outside-pad CSP shown by the one-dot chain line is smallest. When the high frequency signal exceeds about 19 GHz, the attenuation of the high frequency signal of the inside-pad CSP shown by the solid line is smallest, and next the attenuation of the high frequency signal of the center-pad CSP shown by the dotted line is small, but the attenuation of the high frequency signal of the outside-pad CSP shown by the one-dot chain line rapidly increases. That is, the state or amount of the attenuation of the high frequency signal of about 6 GHz to 19 GHz is completely reverse to that of the high frequency signal exceeding about 19 GHz. Therefore, it is preferably appropriately selected by the frequency of the high frequency signal transmitted to the wiring 25 whether to dispose the dummy pad portion 26 in a point constituting the bent portion of the wiring 25, inside the bent portion of the wiring 25, or outside the bent portion of the wiring 25. Supposing that the frequency of the transmitted high frequency signal is smaller than about 19 GHz, or exceeds about 19 GHz, the bent portion is most preferably positioned in the pad center as shown by the dotted line.

Next, the function of the opening 11 of the ground layer 6 under the dummy pad portion 7b shown in FIG. 2 will be described together with the experiment result. First, the semiconductor device substantially similar to that shown in FIGS. 5A, 5B was prepared. Additionally, in this case, the diameters of the dummy pad portion 26 and dummy post 29 were set to 150 $\mu$m, and the other dimensions were set in the same manner as in the above-described case.

Moreover, the followings were prepared: a first semiconductor device in which an opening having a diameter of 150 $\mu$m (the same as the diameter of the dummy pad portion 26) was formed in the ground layer 23 under the dummy pad portion 26; a second semiconductor device in which the opening having a diameter of 170 $\mu$m was formed; a third semiconductor device in which the opening having a diameter of 190 $\mu$m was formed; a fourth semiconductor device in which the opening having a diameter of 130 $\mu$m was formed; and a fifth semiconductor device in which the opening was not formed. As described above, for the respective semiconductor devices, the device in which the dummy post 29 was not disposed on the dummy pad portion 26, and the device in which the dummy post 29 was disposed were prepared.

Figure 11:
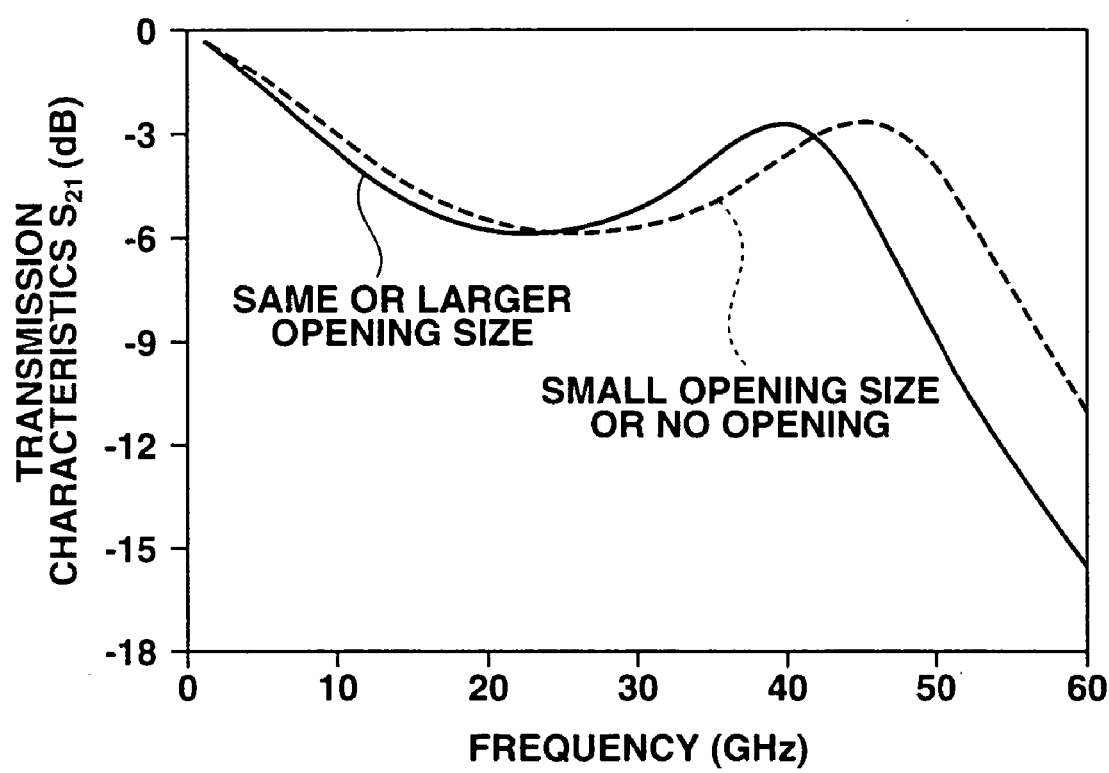
FIG. 11 is a diagram showing the transmission characteristics of the high frequency signal by another experiment.

Moreover, when the transmission characteristics $S_{21}$ of the high frequency signals of the first to fifth semiconductor devices were measured, the results shown in FIG. 11 were obtained. That is, in the first to third semiconductor devices, substantially the same transmission characteristics $S_{21}$ were obtained as shown by the solid line in FIG. 11. In the fourth and fifth semiconductor devices, substantially the same transmission characteristics $S_{21}$ were obtained as shown by the dotted line in FIG. 11. Moreover, the device in which the dummy post 29 was not disposed on the dummy pad portion 26 and the device in which the dummy post 29 was disposed indicated substantially the same transmission characteristics $S_{21}$. Therefore, in FIG. 11, the same characteristic curves are shown.

As apparent from FIG. 11, the attenuations of the high frequency signals of the first to third semiconductor devices shown by the solid line are smaller than those of the fourth and fifth semiconductor devices shown by the dotted line in a frequency band of about 26 GHz to about 42 GHz. However, this relation is reversed in another frequency band, that is, in the frequency band smaller than about 26 GHz and that larger than about 42 GHz. The attenuations of the fourth and fifth semiconductor devices shown by the dotted line are smaller than those of the first to third semiconductor devices shown by the solid line. In the frequency band smaller than about 26 GHz, the attenuations of the first to third semiconductor devices shown by the solid line are larger than those of the fourth and fifth semiconductor devices shown by the dotted line, but a difference between the both is not very large.

In the above-described experiment, one example was simply used with respect to the size of the dummy pad portion 26, the thickness of the protective film 24, and the like. Therefore, when each parameter is changed, a correlation between the size of the opening of the ground layer 23 and an attenuation ratio of the frequency band is presumed to change. Here, what is important is that the size of the opening formed in the ground layer 23 under the dummy pad portion 26 can be selected to obtain optimum transmission characteristics $S_{21}$ with respect to the frequency transmitted to the wiring.

In consideration of the above, since the circular dummy pad portion 7b broader than the first wiring 7 is disposed midway in the first wiring 7 in order to reduce the attenuation of the high frequency signal as described above, the shape of the whole first wiring 7 including the dummy pad portion 7b largely differs in the portion constituting the dummy pad portion 7b.

As a result, when the opening 11 is not disposed in the ground layer 6, a floating capacity in the portion constituting the dummy pad portion 7b increases, the characteristic impedance largely changes, and the transmission characteristics drop. Then, when the opening 11 having a diameter substantially the same as or larger than that of the dummy pad portion 7b is formed in the ground layer 6 under the dummy pad portion 7b, the floating capacity in the portion constituting dummy pad portion 7b decreases, the change of the characteristic impedance is reduced, and the transmission characteristics can be enhanced.

The opening 12 of the ground layer 6 under the pad portion for external connection 7d shown in FIG. 2 is also disposed for the similar reason. As shown in FIG. 8 and FIGS. 9A and 9B, this also applies to the case in which the wiring includes the bent portion.

In FIG. 11, the solid line and dotted line have a relation such that the lines mutually shift in a left and right direction. From this respect, it can be said that when the diameters of the openings 11, 12 of the ground layer 6 are changed in accordance with the frequency, it can be said to be possible to shift a satisfactory range of the transmission characteristics $S_{21}$.

In the first embodiment, the ground layer 6 is disposed under the wirings 7, 8, 9. However, the ground layer can be formed on the protective film in the same manner as the wiring as hereinafter described as a second embodiment.

Second Embodiment

Figure 12:
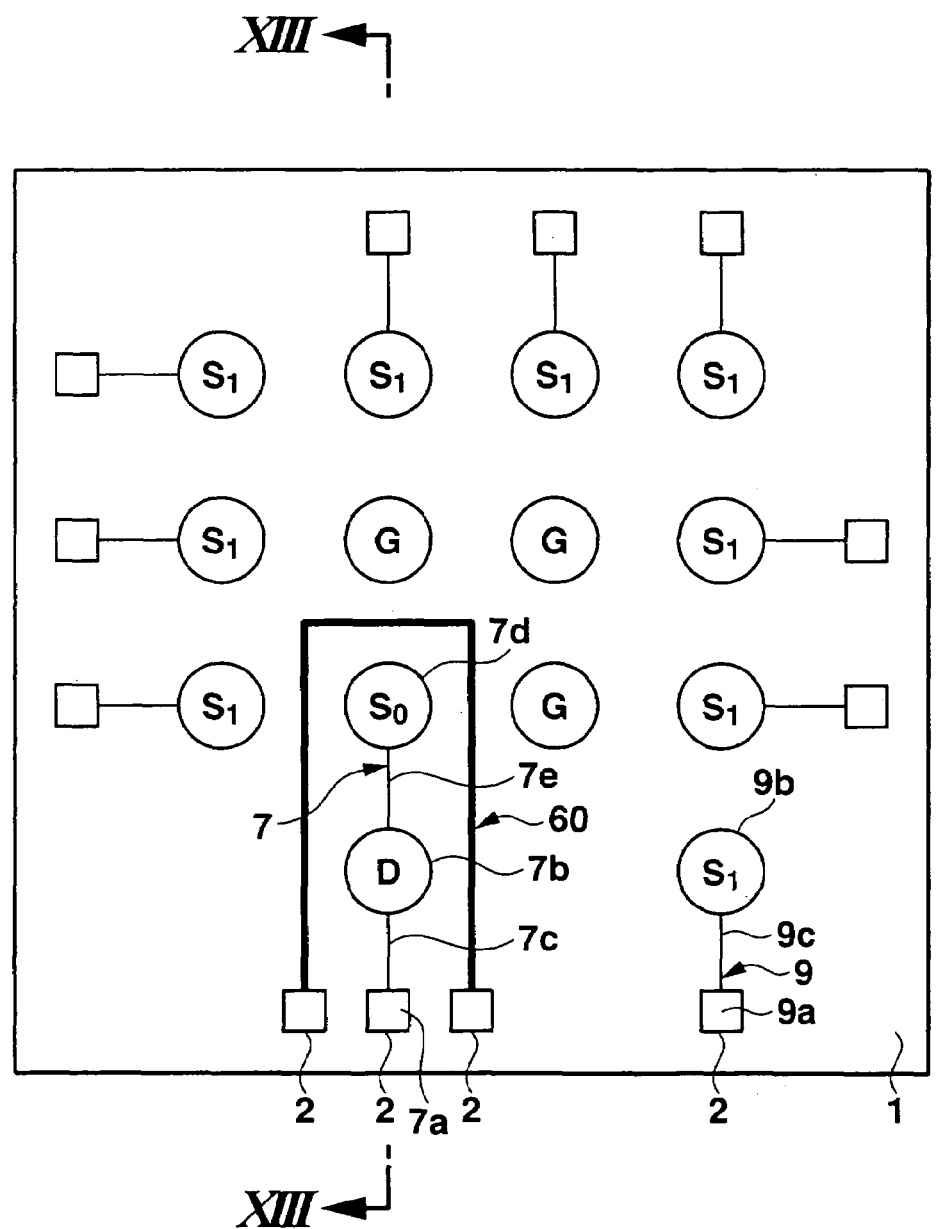
FIG. 12 is a perspective plan view of the major part of the semiconductor device showing a second embodiment of the present invention.
Figure 13:
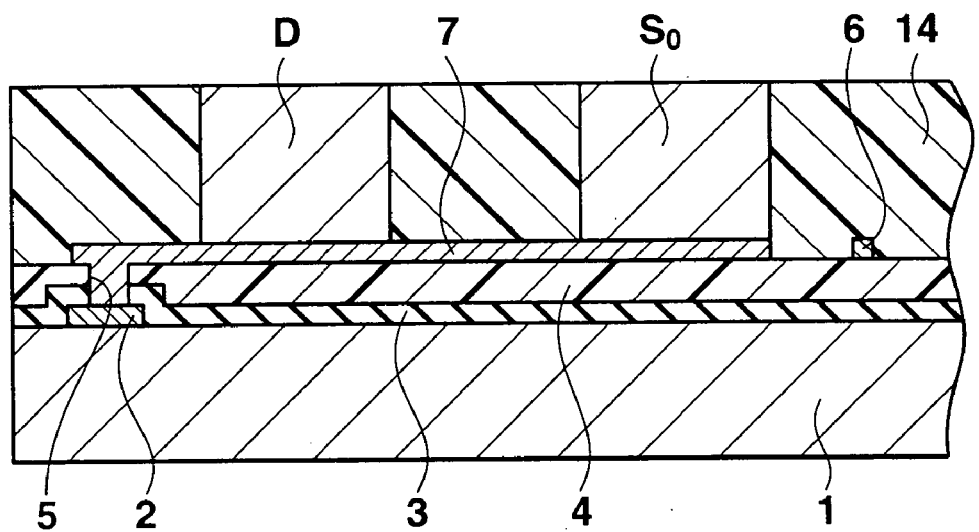
FIG. 13 is a sectional view of a part taken along line XIII—XIII of FIG. 12.

FIG. 12 is a perspective plan view of the major part of the semiconductor device as one embodiment of the present invention, and FIG. 13 is a sectional view of a part taken along line XIII—XIII of FIG. 12. The second embodiment is different from FIGS. 1 and 2 in that a ground layer 60 is not formed between the first wiring 7, third wiring 9, and the semiconductor substrate 1, and is similarly formed on the protective film 4 in the same manner as the first wiring 7 and third wiring 9. The ground layer 60 is formed in a U-shaped pattern surrounding three sides excluding one side on the side of the connection pad 2 of the first wiring 7, and is connected to the connection pads 2 disposed adjacent to the connection pad 2 connected to the first wiring 7. Therefore, the same materials as those of the first wiring 7 and third wiring 9 can be used to pattern/form the ground layer 60 in the same process as that of the first wiring 7 and third wiring 9, and productivity is efficient. Alternately, the ground layer 60 may also be formed so as to surround the whole periphery of the first wiring 7 as the need arises.

In the above description, the first wiring 7 which is a wiring for the high frequency signal includes the dummy pad portion 7b and the pad portion 7d for external connection. The dummy post D is formed on the dummy pad portion 7b, and the post for external connection $S_0$ is formed on the pad portion 7d for external connection. Only one first wiring 7 is shown as the transmission/reception signal line, but the transmission signal line may also be disposed separately from the reception signal line. In this case, the first wiring 7 is disposed in a region surrounded by the ground layer 60.

Since the other constitution is the same as that of the first embodiment, the description is omitted.

Next, the functions of the dummy pad portion 6b and dummy post 10 will be described together with the experiment results. First, for the first experiment, the semiconductor devices shown in FIGS. 14A, 14B were prepared. The semiconductor device includes the semiconductor substrate 21 having the plane square shape. The oxide film 22 formed of the insulating materials such as silicon oxide and the protective film 24 formed of the organic resins such as polyimide are disposed on the upper surface of the semiconductor substrate 21 in this order.

Figure 14A:
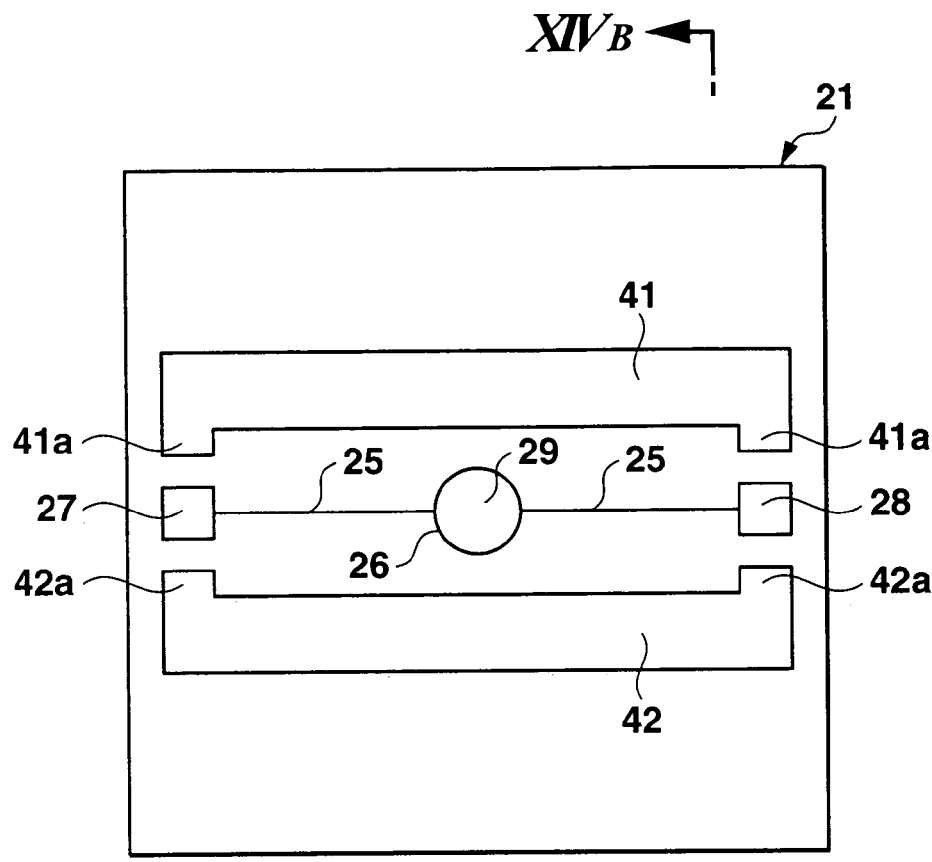
FIG. 14A is a plan view of the semiconductor device used in a third experiment.
Figure 14B:
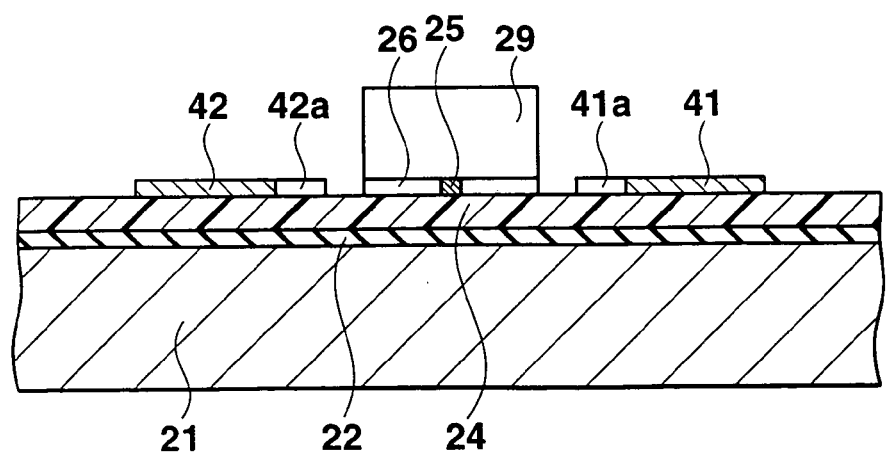
FIG. 14B is a sectional view of a part taken along line $XN_B$—$XN_B$ of FIG. 14A.

The wiring 25 formed of copper is disposed to extend in the longitudinal direction in the middle part of the upper surface of the protective film 24 in the vertical direction in FIG. 14A. In this case, the circular dummy pad portion 26 is disposed in the middle part of the wiring 25. The connection terminals 27, 28 having the square shapes are disposed on the opposite ends of the wiring 25. The dummy post 29 formed of copper and having the columnar shape is disposed on the upper surface of the dummy pad portion 26.

Ground layers 41, 42 formed of copper are disposed along and in parallel with the wiring 25 on the opposite sides of a width direction of the wiring 25 on the upper surface of the protective film 24. Projections 41a, 42a each forming a part of the connection terminal are disposed to face the connection terminals 27, 28 in the opposite ends of the ground layers 41, 42.

Here, the wiring 25 corresponds to the first wiring 7 shown in FIG. 12. The dummy pad portion 26 corresponds to the dummy pad portion 7b shown in FIG. 12. The dummy post 29 corresponds to the dummy post D shown in FIG. 12. The ground layers 41, 42 correspond to the third wiring 9 shown in FIG. 12.

Next, one example of the dimensions of the semiconductor device constituted as described above will be described. The plane size of the semiconductor substrate 21 is 2400× 2400 $\mu$m, and the thickness is 600 $\mu$m. The thickness of the oxide film 22 is 0.5 $\mu$m. The thickness of the protective film 24 is 6 $\mu$m. The thickness of the wiring 25 including the connection terminals 27, 28 and dummy pad portion 26 is 5 $\mu$m. The width of the wiring 25 is 10 $\mu$m. The length of the wiring 25 including the dummy pad portion 26 is 1800 $\mu$m. The plane sizes of the connection terminals 27, 28 are each 170×170 $\mu$m. The diameters of the dummy pad portion 26 and dummy post 29 are each 300 $\mu$m. The height of the dummy post 29 is 100 $\mu$m.

The lengths of the ground layers 41, 42 are each 2140 $\mu$m. The length of the portion excluding the projections 41a, 42a of the ground layers 41, 42 is 1800 $\mu$m. Therefore, the length of the projections 41a, 42a is 170 $\mu$m which is the same as that of one side of the opposite connection terminals 27, 28. The width of the portion including the projections 41a, 42a of the ground layers 41, 42 is 340 $\mu$m. An interval between the projections 41a, 42a and the connection terminals 27, 28 is 130 $\mu$m.

Figure 15:
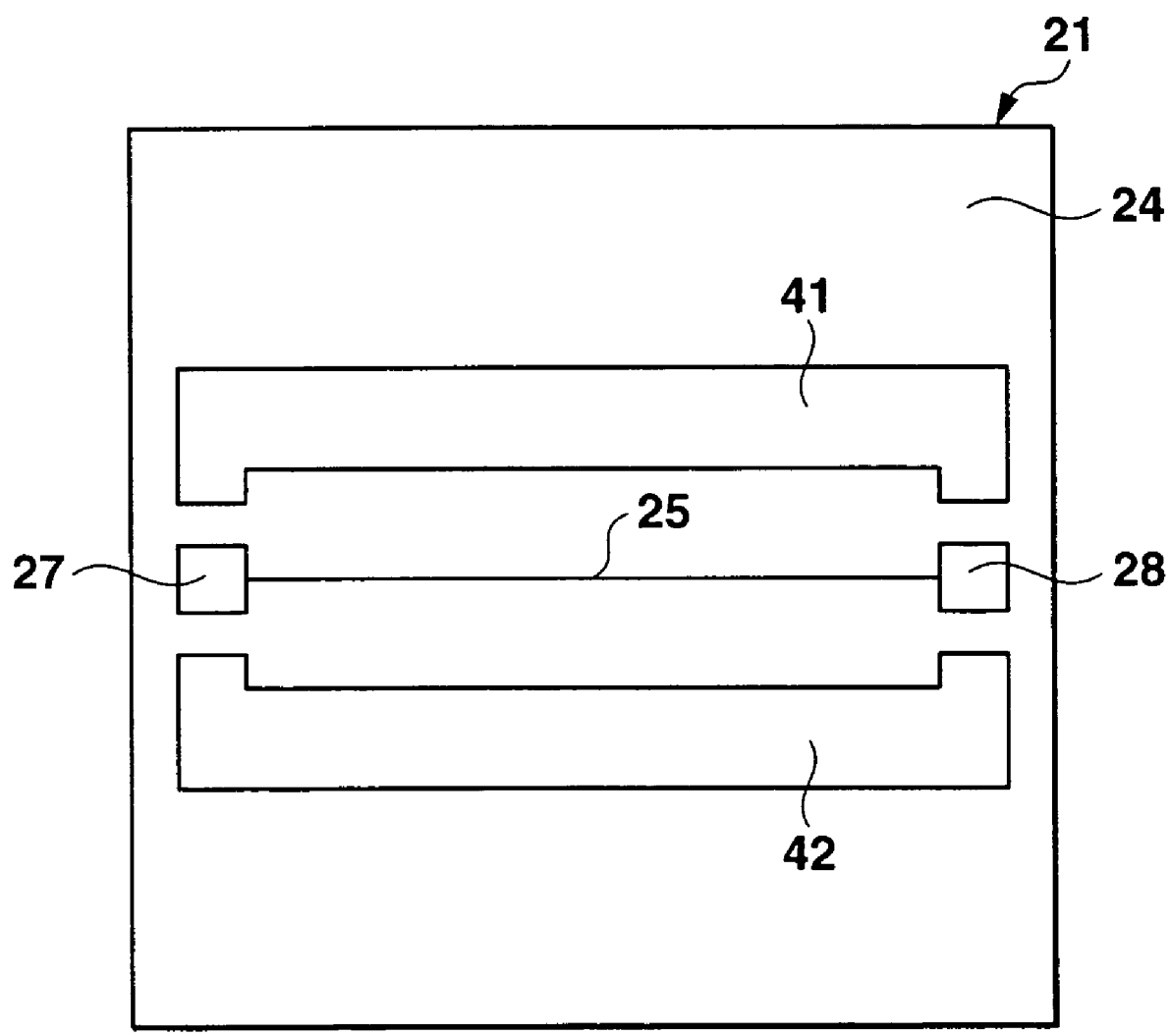
FIG. 15 is a plan view of another semiconductor device used in the third experiment.

Next, the measuring instruments such as the network analyzer were used to check the transmission characteristics $S_{21}$ of the high frequency signal of the semiconductor device constituted as described above. In this case, the probe for measurement was brought in contact with the portions constituting the connection terminals 27, 28 and projections 41a, 42a. Moreover, for the semiconductor device of the present invention, the device including the dummy post 29 on the dummy pad portion 26 (hereinafter referred to as the CSP including the post), and the device which included the dummy pad portion 26 but in which the dummy post 29 was not formed on the portion (hereinafter referred to as the CSP without the post) were prepared. For comparison, as shown in FIG. 15, the semiconductor device which did not include the dummy post 29 and dummy pad portion 26 and which included only the wiring 25 was prepared (hereinafter referred to as the CSP including only the wiring).

Figure 16:
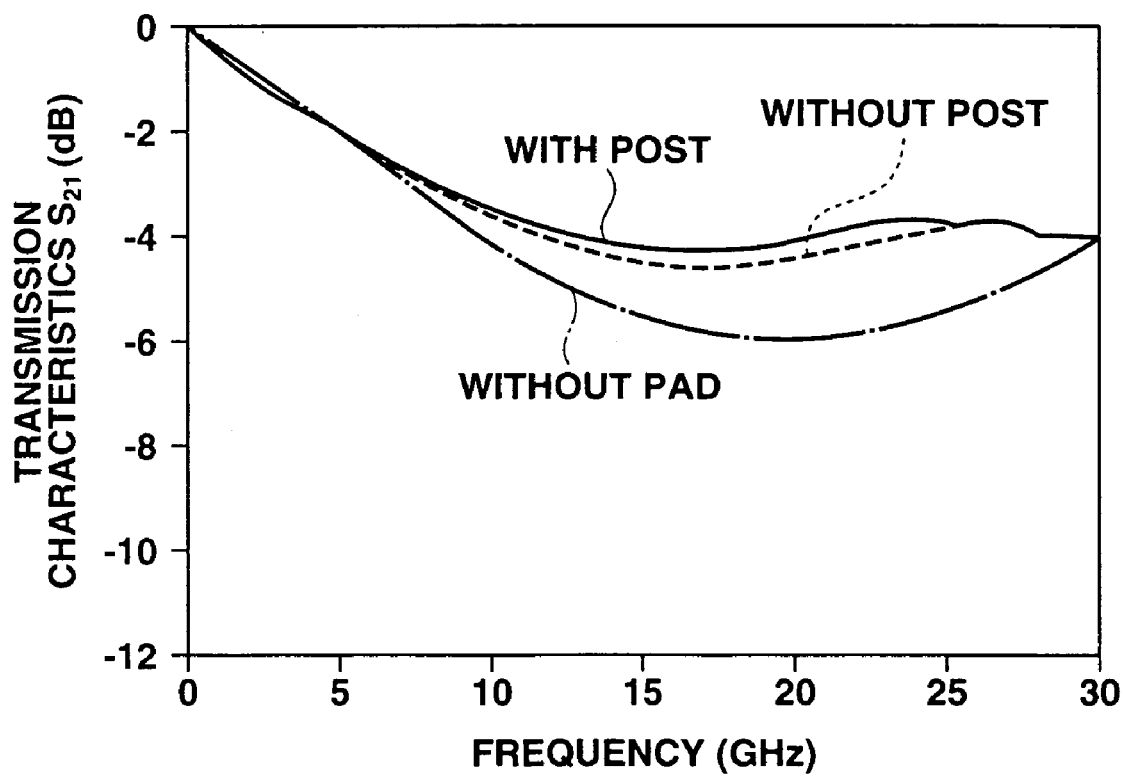
FIG. 16 is a diagram showing the transmission characteristics of the high frequency signal by the third experiment.

Moreover, when the transmission characteristics $S_{21}$ of the high frequency signal of each CSP were measured, the results shown in FIG. 16 were obtained. In FIG. 16, the solid line indicates the transmission characteristics $S_{21}$ of the CSP including the post, the dotted line indicates the transmission characteristics $S_{21}$ of the CSP without the post, and the one-dot chain line indicates the transmission characteristics $S_{21}$ of the CSP including only the wiring or no pad.

As apparent from FIG. 16, up to about 5 GHz, the attenuation of the high frequency signal of the CSP including only the wiring (without the pad), shown by the one-dot chain line, is smaller than that of the CSP including the post, shown by the solid line, and the CSP without the post, shown by the dotted line. However, with the frequency exceeding about 5 GHz, this is reversed, and the attenuations of the CSP including the post, shown by the solid line, and the CSP without the post, shown by the dotted line, are smaller than that of the CSP without the pad, shown by the one-dot chain line. Therefore, in the frequency band of about 5 GHz or more, the attenuation of the high frequency signals of the CSP including the post and the CSP without the post can be reduced as compared with the CSP without the pad.

Next, seen from the CSP including the post shown by the solid line and the CSP without the post shown by the dotted line, the attenuation of the high frequency signal of the CSP including the post shown by the solid line is slightly smaller than that of the CSP without the post shown by the dotted line in the frequency band of about 5 GHz to about 25 GHz, Therefore, in the frequency band of about 5 GHz to about 25 GHz, the attenuation of the high frequency signal of the CSP including the post can slightly be suppressed as compared with the CSP without the post.

In the above-described third experiment, the wiring 25 is assumed as the straight line. Next, as a fourth experiment, the wiring including the bent portion will be described. In this case, the semiconductor device shown in FIG. 17 was prepared. In the semiconductor device shown in FIG. 17, the portions having the same names as those of the semiconductor device shown in FIG. 12 are denoted with the same reference numerals and described. It is to be noted that the sectional shape of this semiconductor device is basically the same as that shown in FIG. 13.

In this semiconductor device, the wiring 25 is bent substantially by 90° in the middle part or center point, and the circular dummy pad portion 26 is positioned in the portion constituting the bent portion of the wiring 25. In this case, the center of the dummy pad portion 26 corresponds to that of the semiconductor substrate 21, and is disposed in the center point of the bent portion of the wiring 25. Therefore, the center of the columnar dummy post 29 disposed on the dummy pad portion 26 is also disposed in the point constituting the bent portion. Two ground layers 43, 44 are disposed to surround the wiring 25, and are entirely disposed in a substantially square frame shape.

Next, one example of the dimensions of the semiconductor device constituted as described above will be described. The plane size of the semiconductor substrate 21 is 2400× 2400 µm. The width of the wiring 25 is 10 µm. The plane size of the connection terminals 27, 28 is 170×170 µm. The diameters of the dummy pad portion 26 and dummy post 29 are each 300 µm. The height of the dummy post 29 is 100 µm.

Figure 17:
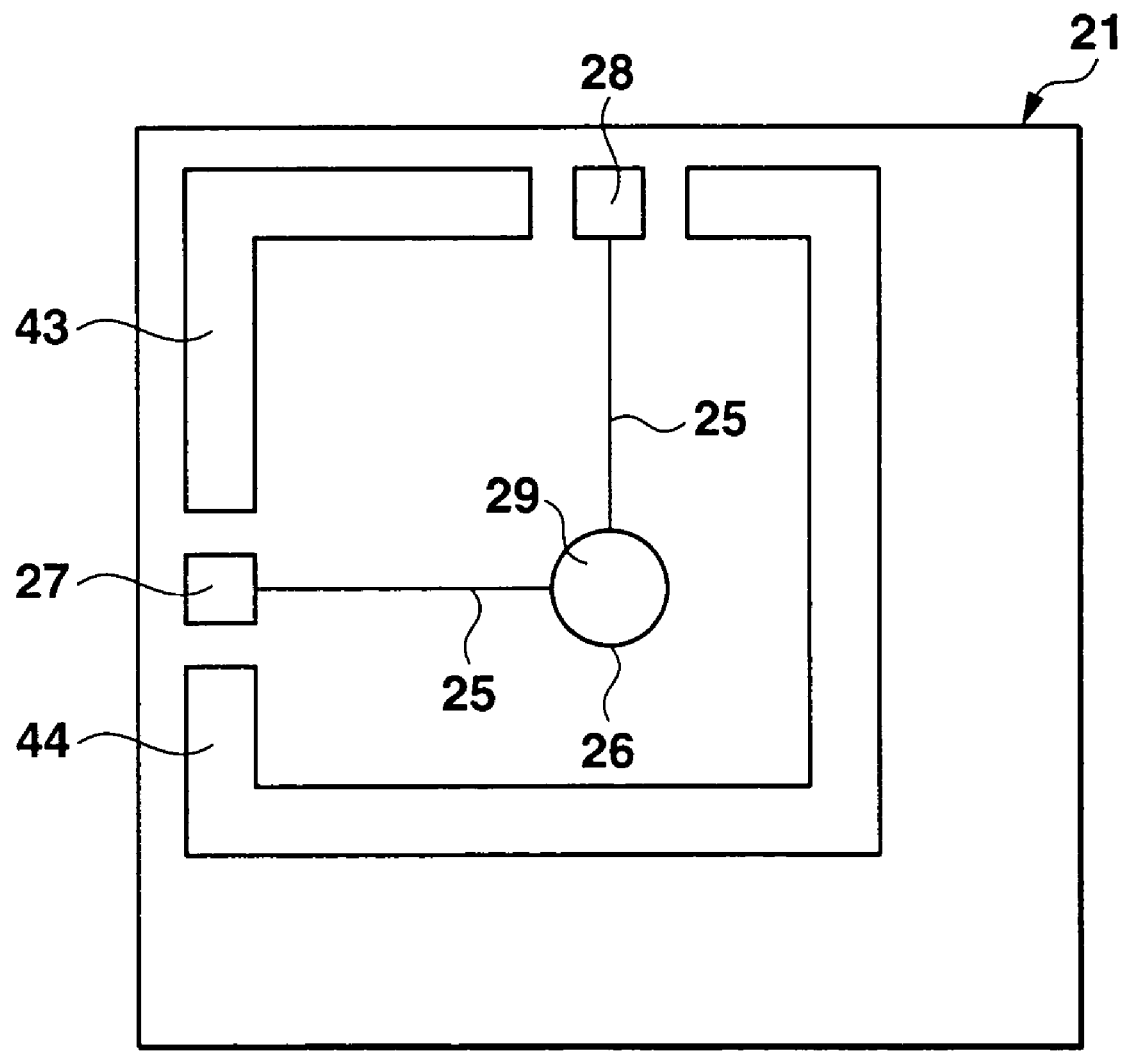
FIG. 17 is a plan view of the semiconductor device used in a fourth experiment.

The widths of the ground layers 43, 44 are the same as the length of one side of the connection terminals 27, 28 which is 170 µm. On the other hand, that is, the length of one side of the left upper ground layer 43 of FIG. 17 is 855 µm. The length of a long side of the other ground layer 44 is 1755 µm, and the length of a short side is 470 µm. The interval between the ground layers 43, 44 and the connection terminals 27, 28 is 130 µm. The length of each wiring 25 excluding the connection terminals 27, 28 is 895 µm to the center of the circular dummy pad portion 26 formed in the position constituting the bent portion.

Figure 18:
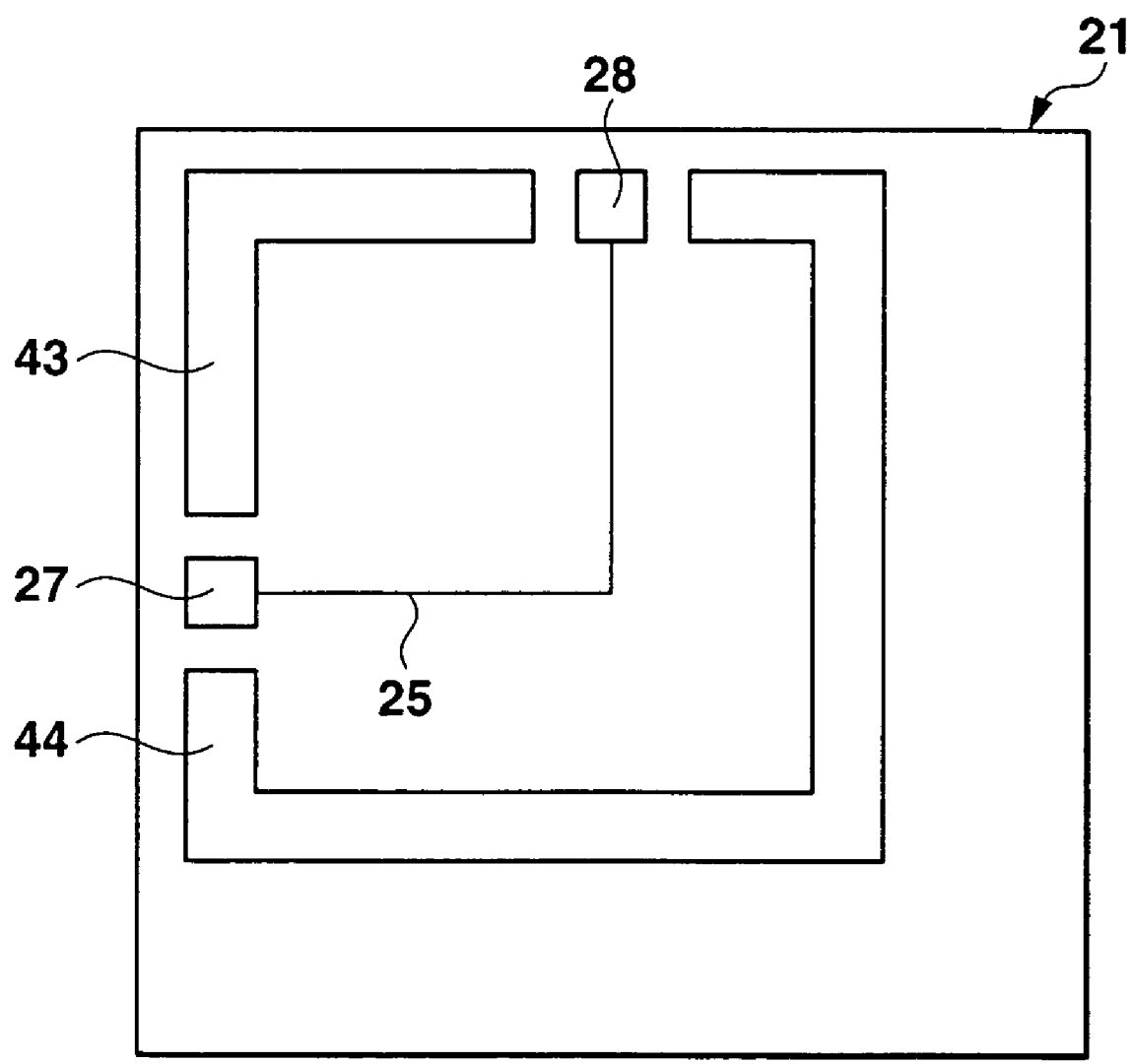
FIG. 18 is a plan view of another semiconductor device used in the fourth experiment.

Next, the transmission characteristics $S_{21}$ of the high frequency signal of the semiconductor device constituted as described above were checked using the measuring instruments such as the network analyzer. In this case, for the semiconductor devices of the present invention, the device in which the dummy post 29 was disposed on the dummy pad portion 26 (hereinafter referred to as the CSP including the post), and the device in which the dummy pad portion 26 was disposed but the dummy post 29 was not formed on the portion (hereinafter referred to as the CSP without the post) were prepared. Moreover, for comparison, as shown in FIG. 18, the semiconductor device which did not include the dummy post 29 and dummy pad portion 26 and which included only the wiring 25 (hereinafter referred to as the CSP including only the wiring or without the pad) was prepared.

Figure 19:
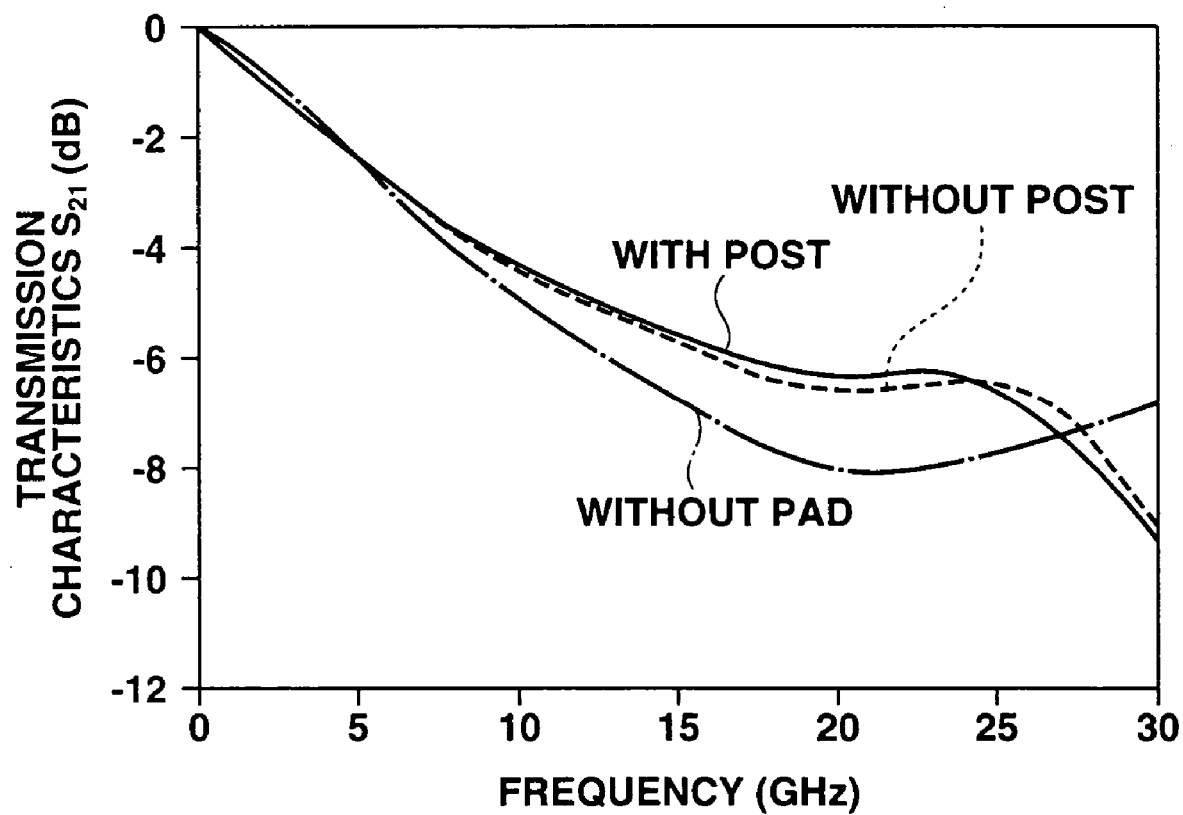
FIG. 19 is a diagram showing the transmission characteristics of the high frequency signal by the fourth experiment.

In the above-described semiconductor device, when the transmission characteristics $S_{21}$ of the high frequency signal of each CSP were measured, the results shown in FIG. 19 were obtained. In FIG. 19, the solid line indicates the transmission characteristics $S_{21}$ of the CSP including the post, the dotted line indicates the transmission characteristics $S_{21}$ of the CSP without the post, and the one-dot chain line indicates the transmission characteristics $S_{21}$ of the CSP without the pad.

As apparent from FIG. 19, for the attenuation of the high frequency signal, up to about 5 GHz and at about 27 GHz or more, the attenuation of the CSP without the pad shown by the one-dot chain line is smaller than that of the CSP including the post shown by the solid line and the CSP without the post shown by the dotted line. However, in an intermediate frequency band, this relation is reversed, and the attenuations of the CSP including the post shown by the solid line and the CSP without the pad shown by the dotted line are smaller than the attenuation of the CSP without the pad shown by the one-dot chain line.

Therefore, in the frequency band of about 5 GHz to about 27 GHz, the attenuations of the high frequency signals of the CSP including the post and the CSP without the post can be reduced as compared with the CSP including only the wiring. As a result, in FIG. 1, even when the width of the first wiring 7 as the transmission/reception signal line of Bluetooth is, for example, about 10 µm and remarkably small, the attenuation of the high frequency signal can be reduced. It is to be noted that the CSP including only the wiring is preferable in the frequency band of about 5 GHz or less, but it is not to say that there is a remarkable difference between the CSP including the post and the CSP without the post.

Next, seen from the CSP including the post shown by the solid line and the CSP without the post shown by the dotted line, the attenuation of the high frequency signal of the CSP including the post shown by the solid line is slightly smaller than that of the CSP without the post shown by the dotted line in the frequency band of about 5 GHz to about 23 GHz. Therefore, the attenuation of the high frequency signal in the CSP including the post can slightly be reduced as compared with the CSP without the post in the frequency band of about 5 GHz to about 23 GHz.

In the above-described fourth experiment, the case in which the center of the dummy pad portion 26 was disposed so as to agree with the center point of the bent portion of the wiring 25. Next, a fifth experiment will be described in which the dummy pad portion 26 is disposed inside and outside of the bent portion of the wiring 25. In this case, the semiconductor devices shown in FIGS. 20A, 20B were prepared. In the semiconductor device shown in FIG. 20A, the dummy pad portion 26 is disposed inside the bent portion of the wiring 25. In the semiconductor device shown in FIG. 20B, the dummy pad portion 26 is disposed outside the bent portion of the wiring 25. In this case, only the dummy pad portion 26 is disposed, and the post is not disposed on the portion. Here, the point at which two line segments of one high frequency signal wiring intersect with each other is assumed as the center point of the bent portion. When the center of the dummy pad is positioned on the side having a small intersection angle of two line segments centering on the bent point, it is assumed that the pad is positioned inside the bent portion. When the center is positioned on the side having a large intersection angle of two line segments centering on the bent point, it is assumed that the pad is positioned outside the bent portion.

Figure 20A:
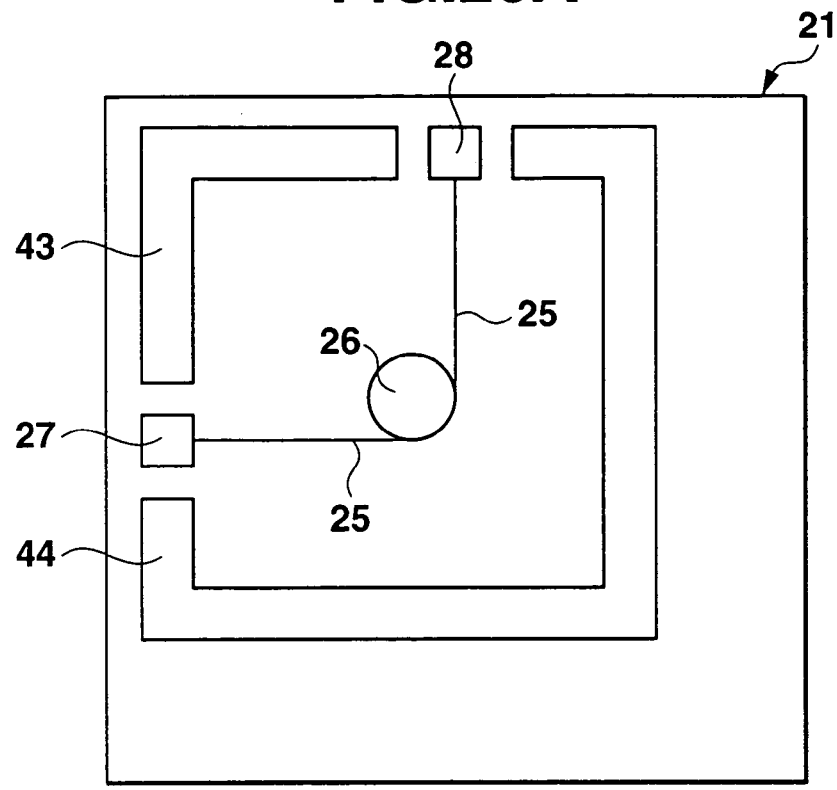
FIGS. 20A and 20B are plan views of the semiconductor device used in a fifth experiment, respectively.
Figure 20B:
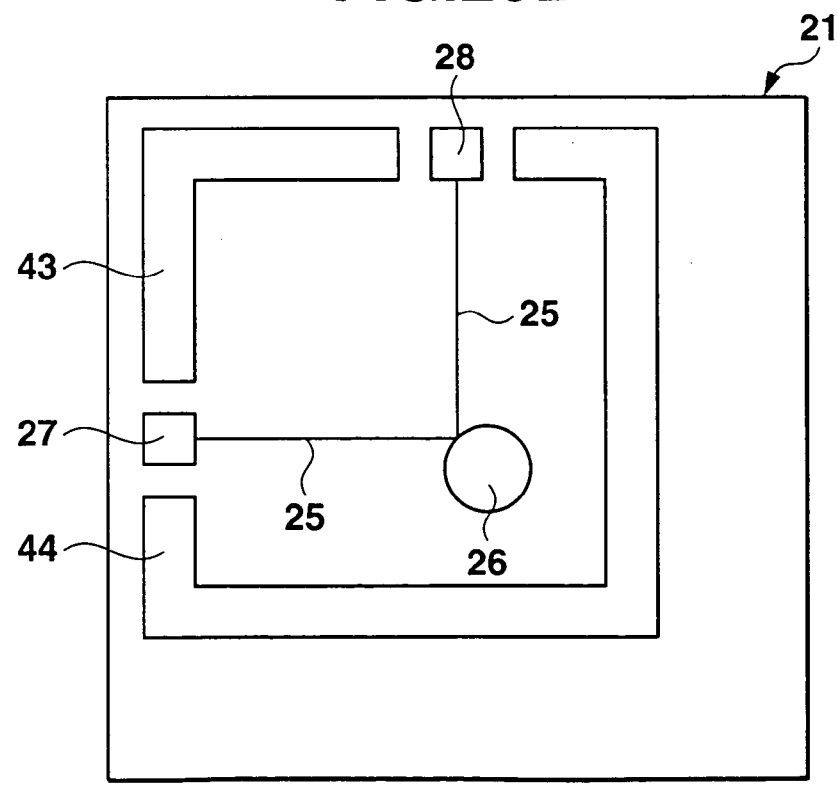
Figure 21:
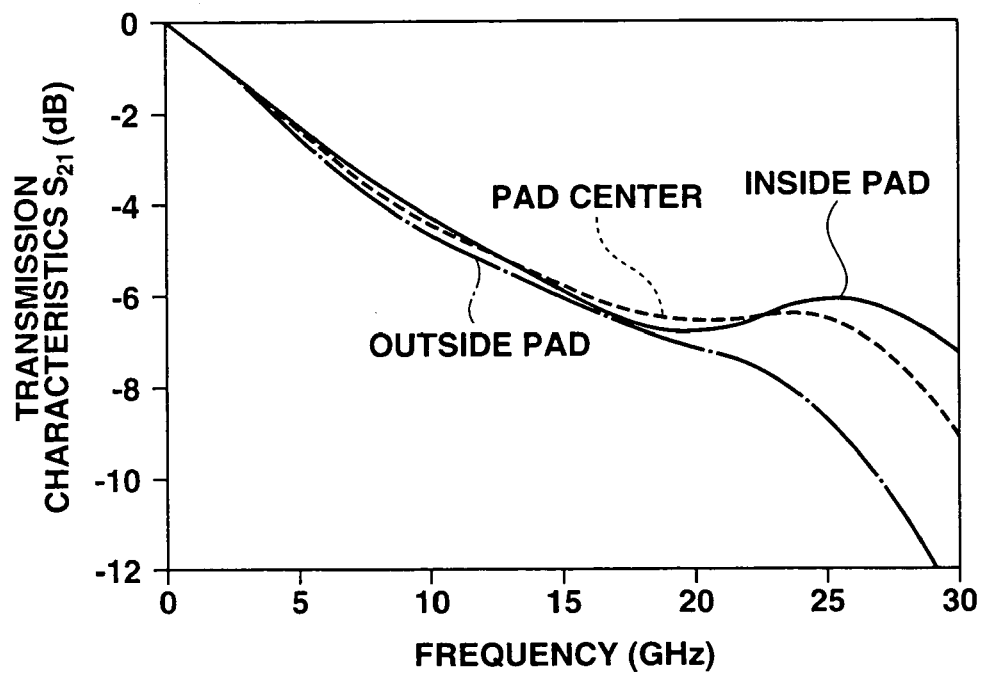
FIG. 21 is a diagram showing the transmission characteristics of the high frequency signal by the fifth experiment.

Next, when the transmission characteristics $S_{21}$ of the high frequency signals of the semiconductor devices shown in FIGS. 20A, 20B were measured, the results shown in FIG. 21 were obtained. In FIG. 21, the solid line shows the transmission characteristics $S_{21}$ of the semiconductor device (hereinafter referred to as the inside-pad CSP) shown in FIG. 20A, and the one-dot chain line shows the transmission characteristics $S_{21}$ of the semiconductor device (hereinafter referred to as the outside-pad CSP) shown in FIG. 20B. In this case, the dotted line shown in FIG. 21 shows the transmission characteristics $S_{21}$ of the semiconductor device (hereinafter referred to as the center-pad CSP) which includes only the dummy pad portion 26 and in which the post is not disposed on the portion in the case shown in FIG. 17 in the same manner as the dotted line shown in FIG. 19.

As apparent from FIG. 21, the high frequency signal is substantially similarly attenuated for each CSP up to about 19 GHz. However, when the frequency exceeds about 19 GHz, the attenuation of the high frequency signal of the inside-pad CSP shown by the solid line is substantially constant, the attenuation of the high frequency signal of the outside-pad CSP shown by the one-dot chain line rapidly increases, and the attenuation of the high frequency signal of the center-pad CSP shown by the dotted line indicates intermediate properties. Therefore, the dummy pad portion 26 is more preferably disposed in the point constituting the bent portion of the wiring 25 or inside the bent portion of the wiring 25 rather than disposed outside the bent portion of the wiring 25.

In the above-described embodiment, only one dummy pad portion and dummy post are formed in the wiring for the high frequency signal. However, when the wiring for the high frequency signal is long, a plurality of wirings may also be disposed at a predetermined interval, for example, at an interval of about 1 mm. Moreover, a ground pattern formed along the high frequency signal wiring is shaped to be integrated with that formed in a pattern shape in each post other than the post for the high frequency signal wiring and around the wiring for the circuit connected to the post, and this is efficient. In the above-described embodiments, the semiconductor device including the wiring for transmitting the high frequency signal has been described, but the present invention can also be applied to the circuit substrates including a high frequency circuit in a device other than the semiconductor device.

As described above, according to the present invention, the ground layer is disposed on the semiconductor substrate, and the wiring including the high frequency signal wiring for transmitting the high frequency signal is disposed on the ground layer via the insulating film. Therefore, the wiring including the high frequency signal wiring and the ground layer may be disposed only on one surface of the semiconductor substrate, and therefore the manufacturing process can be simplified.

Moreover, according to the present invention, the dummy pad portion for reducing the attenuation of the high frequency signal is disposed midway in the high frequency signal wiring for transmitting the high frequency signal. Therefore, even when the width of the high frequency signal wiring is small, the attenuation of the high frequency signal can be reduced.

What is claimed is:

1. A high frequency signal transmission structure comprising:
   a substrate;
   a high frequency signal wiring formed on the substrate, the high frequency signal wiring including: a connection portion, a pad portion for external connection, and at least one dummy pad portion disposed between the connection portion and the pad portion for external connection so as to restrain attenuation of a high frequency signal;
   a post for external connection formed on the pad portion for external connection;
   a dummy post formed on the dummy pad portion; and
   a sealing film formed on the substrate excluding a portion corresponding to the post for external connection and a portion corresponding to the dummy pad portion.

2. The high frequency signal transmission structure according to claim 1, wherein a high frequency signal of at least 5 GHz is transmitted to the high frequency signal wiring in a circuit substrate for the high frequency signal.

3. The high frequency signal transmission structure according to claim 2, wherein the high frequency signal wiring is substantially linear over a total length in the circuit substrate for the high frequency signal.

4. A high frequency signal transmission structure comprising:
   a semiconductor substrate including an integrated circuit; and
   a high frequency signal wiring formed on the substrate, the high frequency signal wiring including: a connection portion, a pad portion for external connection, and at least one dummy pad portion disposed between the connection portion and the pad portion for external connection so as to restrain attenuation of a high frequency signal.

5. The high frequency signal transmission structure according to claim 4, wherein the dummy pad portion of the high frequency signal wiring is disposed between the connection portion and the pad portion for external connection in a position where impedances of the respective portions are substantially equal.

6. The high frequency signal transmission structure according to claim 4, further comprising a post for external connection formed on the pad portion for external connection.

7. The high frequency signal transmission structure according to claim 6, further comprising a dummy post formed on the dummy pad portion.

8. The high frequency signal transmission structure according to claim 7, further comprising a sealing film formed on the substrate excluding a portion corresponding to a post for external connection and a portion corresponding to the dummy pad portion.

9. The high frequency signal transmission structure according to claim 4, wherein the semiconductor substrate includes a connection pad connected to the integrated circuit, and the connection portion of the high frequency signal wiring is connected to the connection pad.

10. The high frequency signal transmission structure according to claim 4, wherein the high frequency signal wiring is substantially linear over a total length, and a high frequency signal of at least 19 GHz is transmitted to the high frequency signal wiring.

11. The high frequency signal transmission structure according to claim 4, wherein the high frequency signal wiring includes a bent portion in which a direction of the wiring is bent, and the dummy pad portion is formed on the bent portion.

12. The high frequency signal transmission structure according to claim 11, wherein a center of the dummy pad portion is positioned at a center point of the bent portion.

13. The high frequency signal transmission structure according to claim 4, wherein the high frequency signal wiring includes a bent portion in which a direction of the wiring is bent, and the dummy pad portion is formed outside the bent portion.

14. The high frequency signal transmission structure according to claim 13, wherein a high frequency signal of about 6 GHz to about 19 GHz is transmitted to the high frequency signal wiring.

15. The high frequency signal transmission structure according to claim 4, wherein the high frequency signal wiring includes a bent portion in which a direction of the wiring is bent, and the dummy pad portion is formed inside the bent portion.

16. The high frequency signal transmission structure according to claim 15, wherein a high frequency signal of at least 19 GHz is transmitted to the high frequency signal wiring.

17. A high frequency signal transmission structure comprising:
    a substrate;
    a high frequency signal wiring formed on the substrate, the high frequency signal wiring including: a connection portion, a pad portion for external connection, and at least one dummy pad portion disposed between the connection portion and the pad portion for external connection so as to restrain attenuation of a high frequency signal;
    a ground layer; and
    an insulating film formed on the ground layer between the substrate and the high frequency signal wiring.

18. The high frequency signal transmission structure according to claim 17, wherein the ground layer includes an opening which has one of a same width as and a larger width than a width of the high frequency signal wiring and which is positioned in a portion corresponding to the high frequency signal wiring.

19. The high frequency signal transmission structure according to claim 17, further comprising a ground post connected to the ground layer and formed on the insulating film.

20. The high frequency signal transmission structure according to claim 17, wherein the ground layer surrounds at least three peripheral directions of the high frequency signal wiring and is formed on a same plane as the high frequency signal wiring.

21. A high frequency signal transmission structure comprising:
    a substrate;
    a high frequency signal wiring formed on the substrate, the high frequency signal wiring including: a connection portion, a pad portion for external connection, a bent portion in which a direction of the wiring is bent, and at least one dummy pad portion formed at the bent portion and disposed between the connection portion and the pad portion for external connection so as to restrain attenuation of a high frequency signal.

22. The high frequency signal transmission structure according to claim 21, wherein a center of the dummy pad portion is positioned at a center point of the bent portion.

23. The high frequency signal transmission structure according to claim 21, wherein the dummy pad portion is formed at an inside of the bent portion.

24. The high frequency signal transmission structure according to claim 23, wherein a high frequency signal of at least 19 GHz is transmitted to the high frequency signal wiring.

25. A high frequency signal transmission structure comprising:
    a semiconductor substrate including an integrated circuit and a connection pad connected to the integrated circuit;
    an insulating film formed on the semiconductor substrate and including an opening in which the connection pad is exposed;
    a ground layer formed on the insulating film;
    a protective film formed to coat the ground layer;
    a wiring for transmitting a high frequency signal, which is formed on the substrate and which includes: a connection portion connected to the connection pad, a pad portion for external connection, and at least one dummy pad portion disposed between the connection portion and the pad portion for external connection so as to restrain attenuation of the high frequency signal; and
    a post for external connection formed on the pad portion for external connection of the wiring.

26. The high frequency signal transmission structure according to claim 25, wherein the connection pad is arranged in a peripheral edge portion of the semiconductor substrate, and the ground layer is formed substantially all over an interior of the semiconductor substrate with respect to the peripheral edge portion.

27. The high frequency signal transmission structure according to claim 26, wherein the ground layer includes an opening which has one of a same width as and a larger width than a width of the high frequency signal wiring and which is positioned in a portion corresponding to the high frequency signal wiring.

28. A high frequency signal transmission structure comprising:
    a semiconductor substrate including an integrated circuit and a connection pad connected to the integrated circuit;
    an insulating film formed on the semiconductor substrate and including an opening in which the connection pad is exposed;
    a wiring for transmitting a high frequency signal, which is formed on the insulating film and connected to the connection pad, and which includes a connection portion, a pad portion for external connection, and at least one dummy pad portion disposed between the connection portion and the pad portion for external connection so as to restrain attenuation of a high frequency signal; and a ground layer surrounding at least three peripheral directions of the wiring for transmitting the high frequency signal on the insulating film.

29. The high frequency signal transmission structure according to claim 28, further comprising a post for external connection formed on the pad portion for external connection of the wiring.

30. The high frequency signal transmission structure according to claim 28, further comprising a dummy post formed on the dummy pad portion.

* * * * *